United States Patent
Sasaki

(10) Patent No.: US 11,236,215 B2
(45) Date of Patent: Feb. 1, 2022

(54) CURABLE COMPOSITION, CURED FILM, OPTICAL FILTER, LAMINATE, SOLID IMAGE PICKUP ELEMENT, IMAGE DISPLAY DEVICE, AND INFRARED SENSOR

(71) Applicant: FUJIFILM Corporation, Tokyo (JP)

(72) Inventor: Daisuke Sasaki, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 839 days.

(21) Appl. No.: 16/104,657

(22) Filed: Aug. 17, 2018

(65) Prior Publication Data

US 2018/0355149 A1 Dec. 13, 2018

Related U.S. Application Data

(63) Continuation of application No. PCT/JP2017/002801, filed on Jan. 26, 2017.

(30) Foreign Application Priority Data

Feb. 25, 2016 (JP) .............................. JP2016-033748

(51) Int. Cl.
*C08K 5/34* (2006.01)
*H01L 27/146* (2006.01)
(Continued)

(52) U.S. Cl.
CPC .............. *C08K 5/3415* (2013.01); *C08F 2/44* (2013.01); *C08F 2/50* (2013.01); *C08F 220/18* (2013.01);
(Continued)

(58) Field of Classification Search
CPC ........ C08K 5/3415; C08K 3/16; C08K 5/005; C08K 5/29; C08K 5/41; C08K 5/435;
(Continued)

(56) References Cited

U.S. PATENT DOCUMENTS 7,820,254 B2 * 10/2010 Harada ................. C09B 23/086
428/1.31
8,012,671 B2 * 9/2011 Kanchiku ............. B41C 1/1008
430/281.1
(Continued)

FOREIGN PATENT DOCUMENTS

JP 2005-336150 A 12/2005
JP 2007-246464 A 9/2007
(Continued)

OTHER PUBLICATIONS

International Preliminary Report on Patentability and Written Opinion of the International Searching Authority (Forms PCT/IB/326, PCT/IB/373, and PCT/ISA/237) For International Application No. PCT/JP2017/002801 dated Sep. 7, 2018, with English Translation of the Written Opinion.
(Continued)

*Primary Examiner* — Seung C Sohn
(74) *Attorney, Agent, or Firm* — Birch, Stewart, Kolasch & Birch, LLP

(57) ABSTRACT

A curable composition includes: a near infrared absorbing compound that includes a cation having an absorption in a near infrared range and an anion; a salt of an anion that is a component other than the near infrared absorbing compound and has a conjugate acid pKa of −8 or lower; and a curable compound.

19 Claims, 1 Drawing Sheet

(51) Int. Cl.
| | |
|---|---|
| C08K 5/3415 | (2006.01) |
| C09B 53/02 | (2006.01) |
| C08F 2/44 | (2006.01) |
| C09B 69/04 | (2006.01) |
| C09B 23/08 | (2006.01) |
| G03F 7/033 | (2006.01) |
| G03F 7/027 | (2006.01) |
| C09B 23/01 | (2006.01) |
| G03F 7/038 | (2006.01) |
| C09B 67/22 | (2006.01) |
| C08K 5/00 | (2006.01) |
| C08F 2/50 | (2006.01) |
| C08F 220/18 | (2006.01) |
| C08K 3/16 | (2006.01) |
| C08K 5/29 | (2006.01) |
| C08K 5/41 | (2006.01) |
| C08K 5/435 | (2006.01) |
| C08K 5/46 | (2006.01) |
| C08K 5/55 | (2006.01) |
| C08L 33/14 | (2006.01) |
| G03F 7/00 | (2006.01) |
| H01L 31/0232 | (2014.01) |
| G02B 3/00 | (2006.01) |
| G02B 5/20 | (2006.01) |

(52) U.S. Cl.
CPC ............ *C08K 3/16* (2013.01); *C08K 5/005* (2013.01); *C08K 5/29* (2013.01); *C08K 5/41* (2013.01); *C08K 5/435* (2013.01); *C08K 5/46* (2013.01); *C08K 5/55* (2013.01); *C08L 33/14* (2013.01); *C09B 23/0066* (2013.01); *C09B 23/0075* (2013.01); *C09B 23/086* (2013.01); *C09B 53/02* (2013.01); *C09B 67/0034* (2013.01); *C09B 69/04* (2013.01); *G03F 7/0007* (2013.01); *G03F 7/027* (2013.01); *G03F 7/033* (2013.01); *G03F 7/0388* (2013.01); *H01L 27/14621* (2013.01); *H01L 31/02327* (2013.01); *C08F 2800/10* (2013.01); *G02B 3/0056* (2013.01); *G02B 5/201* (2013.01); *G02B 5/208* (2013.01); *G02F 2203/11* (2013.01); *H01L 27/14645* (2013.01); *H01L 27/14649* (2013.01)

(58) Field of Classification Search
CPC ..... C08K 5/46; C08K 5/55; C08F 2/44; C08F 2/50; C08F 220/18; C08F 2800/10; C08F 220/1807; C08L 33/14; C09B 23/0066; C09B 23/0075; C09B 23/086; C09B 53/02; C09B 67/0034; C09B 69/04; G03F 7/0007; G03F 7/027; G03F 7/033; G03F 7/0388; H01L 27/14621; H01L 31/02327; H01L 27/14645; H01L 27/14649; G02B 3/0056; G02B 5/201; G02B 5/208; G02F 2203/11

See application file for complete search history.

(56) References Cited

U.S. PATENT DOCUMENTS

| | | |
|---|---|---|
| 2005/0148786 A1 | 7/2005 | Ikeda et al. |
| 2018/0118865 A1 | 5/2018 | Arayama et al. |

FOREIGN PATENT DOCUMENTS

| | | | |
|---|---|---|---|
| JP | 2011-241349 A | | 12/2011 |
| JP | 2013-53240 A | | 3/2013 |
| JP | 2014-58621 A | | 4/2014 |
| JP | 2014-106309 A | | 6/2014 |
| WO | WO 2007/074693 A1 | | 7/2007 |
| WO | WO 2016/194527 A1 | | 12/2016 |

OTHER PUBLICATIONS

International Search Report (form PCT/ISA/210) for International Application No. PCT/JP2017/002801, dated Apr. 18, 2017, with English Translation.

* cited by examiner

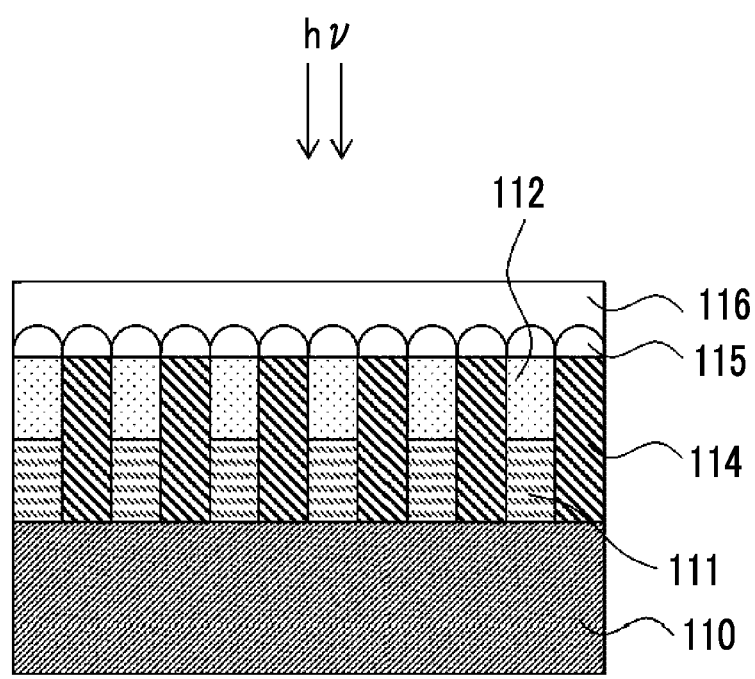

CURABLE COMPOSITION, CURED FILM, OPTICAL FILTER, LAMINATE, SOLID IMAGE PICKUP ELEMENT, IMAGE DISPLAY DEVICE, AND INFRARED SENSOR

CROSS-REFERENCE TO RELATED APPLICATIONS

This application is a Continuation of PCT International Application No. PCT/JP2017/002801 filed on Jan. 26, 2017, which claims priority under 35 U.S.C § 119(a) to Japanese Patent Application No. 2016-033748 filed on Feb. 25, 2016. Each of the above application(s) is hereby expressly incorporated by reference, in its entirety, into the present application.

BACKGROUND OF THE INVENTION

1. Field of the Invention

The present invention relates to a curable composition, a cured film, an optical filter, a laminate, a solid image pickup element, an image display device, and an infrared sensor.

2. Description of the Related Art

As a chromatic colorant used in a color filter, the use of a colorant compound having a cation-anion structure is considered. For example, JP2013-53240A describes that a color filter is formed using a coloring resin composition including: a dye in which a molar ratio (sulfonyl imide anion/dye cation) of a sulfonyl imide anion to a dye cation is 1.05 to 5.0; a solvent; and a binder.

In addition, in a near infrared cut filter, the use of a colorant compound having a cation-anion structure is considered. JP2014-58621A describes that a near infrared cut filter is formed using a composition that includes a cyanine compound including a methide anion as a counter anion.

SUMMARY OF THE INVENTION

Recently, further improvement of heat resistance as a requirement for a near infrared cut filter has been required. In a case where heat resistance of a near infrared cut filter is low, the low heat resistance is likely to have an effect on color in a visible range. For example, the near infrared cut filter may be discolored by heat such that visible transparency deteriorates.

According to an investigation by the present inventors, it was found that a colorant compound having a cation-anion structure, in particular, a near infrared absorbing compound that includes a cation having an absorption in a near infrared range and an anion has low heat resistance in many cases, and thus tends to be discolored by heat. In addition, the present inventors performed an investigation on the near infrared cut filter described in JP2014-58621A and found that the heat resistance of the near infrared cut filter is insufficient.

JP2013-53240A describes a technique for manufacturing a color filter having excellent brightness, in which a chromatic colorant having an absorption in a visible range such as triarylmethane is used as a chromatic colorant to manufacture a violet or blue color filter. However, JP2013-53240A neither describes nor implies a near infrared absorbing compound that includes a cation having an absorption in a near infrared range and an anion.

Accordingly, an object of the present invention is to provide a curable composition with which a cured film or the like having an absorption in a near infrared range and having excellent heat resistance can be manufactured, a cured film, an optical filter, a laminate, a solid image pickup element, an image display device, and an infrared sensor.

As a result of thorough investigation, the present inventors found that, by further adding a salt of an anion having a conjugate acid pKa of −8 or lower to a curable composition including a near infrared absorbing compound that includes a cation having an absorption in a near infrared range and an anion and a curable compound, a cured film having an absorption in a near infrared range and excellent heat resistance can be manufactured, thereby completing the present invention. The present invention provides the following.

<1> A curable composition comprising:
a near infrared absorbing compound that includes a cation having an absorption in a near infrared range and an anion;
a salt of an anion that is a component other than the near infrared absorbing compound and has a conjugate acid pKa of −8 or lower; and
a curable compound.

<2> The curable composition according to <1>,
in which the near infrared absorbing compound includes the cation having an absorption in a near infrared range, and an anion that is present outside a molecule of the cation having an absorption in a near infrared range.

<3> The curable composition according to <1> or <2>,
in which the salt of the anion having a conjugate acid pKa of −8 or lower does not have a maximum absorption wavelength in a visible range.

<4> The curable composition according to any one of <1> to <3>,
in which a molecular weight of the salt of the anion having a conjugate acid pKa of −8 or lower is 100 to 2000.

<5> The curable composition according to any one of <1> to <4>,
in which a content of the salt of the anion having a conjugate acid pKa of −8 or lower is 0.05 to 5 mol with respect to 1 mol of the near infrared absorbing compound.

<6> The curable composition according to any one of <1> to <5>,
in which the near infrared absorbing compound is at least one selected from the group consisting of a cyanine compound and a diimmonium compound.

<7> The curable composition according to any one of <1> to <6>,
in which the near infrared absorbing compound is at least one selected from the group consisting of a compound represented by the following Formula (A1) and a compound represented by the following Formula (A2),

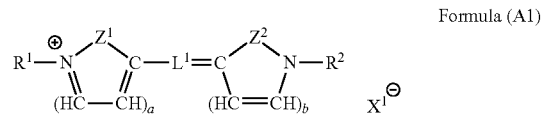

Formula (A1)

-continued

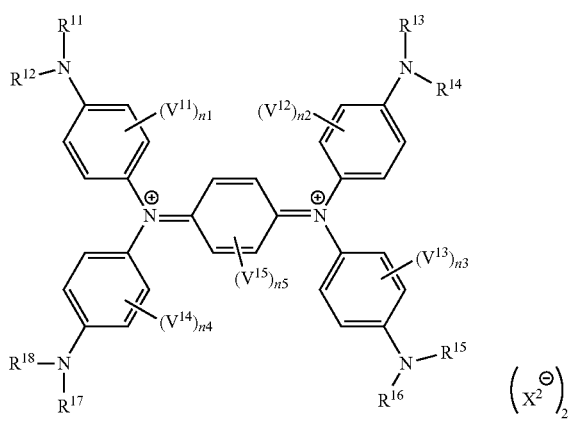

Formula (A2)

in Formula (A1), $Z^1$ and $Z^2$ each independently represent a non-metal atomic group for forming a 5- or 6-membered nitrogen-containing heterocycle which may be fused, $R^1$ and $R^2$ each independently represent an aliphatic group or an aromatic group, $L^1$ represents a methine chain including an odd number of methine groups, a and b each independently represent 0 or 1, and $X^1$ represents an anion; and in Formula (A2), $R^{11}$ to $R^{18}$ each independently represent an alkyl group or an aryl group, $V^{11}$ to $V^{15}$ each independently represent an alkyl group, an aryl group, a halogen atom, an alkoxy group, or a cyano group, $X^2$ represents an anion, and n1 to n5 each independently represent an integer of 0 to 4.

<8> The curable composition according to any one of <1> to <7>, in which the near infrared absorbing compound includes an anion having a conjugate acid pKa of −8 or lower.

<9> The curable composition according to any one of <1> to <8>, in which the salt of the anion having a conjugate acid pKa of −8 or lower is at least one selected from the group consisting of a salt of an anion having a partial structure represented by the following Formula (B1), a salt of an anion having a partial structure represented by the following Formula (B2), and a salt of an anion represented by the following Formula (B3),

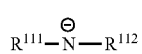
(B1)

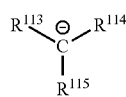
(B2)

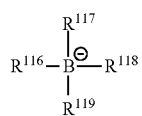
(B3)

in Formula (B1), $R^{111}$ and $R^{112}$ each independently represent —SO$_2$— or —CO—;

in Formula (B2), $R^{113}$ represents —SO$_2$— or —CO— and $R^{114}$ and $R^{115}$ each independently represent —SO$_2$—, —CO—, or a cyano group; and in Formula (B3), $R^{116}$ to $R^{119}$ each independently represent a halogen atom, an alkyl group, an aryl group, an alkoxy group, an aryloxy group, or a cyano group.

<10> The curable composition according to any one of <1> to <9>, in which the salt of the anion having a conjugate acid pKa of −8 or lower is at least one selected from the group consisting of a salt of an anion represented by the following Formula (B1-1), a salt of an anion represented by the following Formula (B2-1), and a salt of an anion represented by the following Formula (B3),

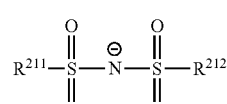
(B1-1)

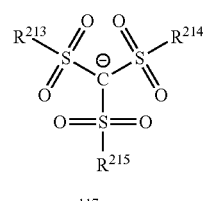
(B2-1)

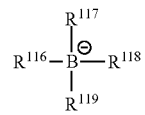
(B3)

in Formula (B1-1), $R^{211}$ and $R^{212}$ each independently represent a halogen atom or an alkyl group, and in a case where $R^{211}$ and $R^{212}$ each independently represent an alkyl group, $R^{211}$ and $R^{212}$ may be bonded to each other to form a ring;

in Formula (B2-1), $R^{213}$ to $R^{215}$ each independently represent a halogen atom or an alkyl group, in a case where $R^{213}$ and $R^{214}$ each independently represent an alkyl group, $R^{213}$ and $R^{214}$ may be bonded to each other to form a ring, in a case where $R^{214}$ and $R^{215}$ each independently represent an alkyl group, $R^{214}$ and $R^{215}$ may be bonded to each other to form a ring, and in a case where $R^{213}$ and $R^{215}$ each independently represent an alkyl group, $R^{213}$ and $R^{215}$ may be bonded to each other to form a ring; and in Formula (B3), $R^{116}$ to $R^{119}$ each independently represent a halogen atom, an alkyl group, an aryl group, an alkoxy group, an aryloxy group, or a cyano group.

<11> The curable composition according to any one of <1> to <10>, in which the salt of the anion having a conjugate acid pKa of −8 or lower is at least one selected from the group consisting of a bis(fluoroalkylsulfonyl)imide salt, a tris(fluoroalkylsulfonyl)methide salt, and a tetracyanoborate salt.

<12> A cured film which is formed using the curable composition according to any one of <1> to <11>.

<13> An optical filter comprising:
the cured film according to <12>.

<14> The optical filter according to <13>,
in which the optical filter is a near infrared cut filter or an infrared transmitting filter.

<15> The optical filter according to <13> or <14> comprising:
a pixel of the cured film according to <12>; and
at least one pixel selected from the group consisting of a red pixel, a green pixel, a blue pixel, a magenta pixel, a yellow pixel, a cyan pixel, a black pixel, and an achromatic pixel.

<16> A laminate comprising:
the cured film according to <12>; and
a color filter that includes a chromatic colorant.
<17> A solid image pickup element comprising: the cured film according to <12>.
<18> An image display device comprising:
the cured film according to <12>.
<19> An infrared sensor comprising:
the cured film according to <12>.

According to the present invention, it is possible to provide a curable composition with which a cured film having an absorption in a near infrared range and having excellent heat resistance can be manufactured, a cured film, an optical filter, a laminate, a solid image pickup element, an image display device, and an infrared sensor.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light generally used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes acrylate and methacrylate, "(meth)acryl" denotes acryl and methacryl, and "(meth)acryloyl" denotes acryloyl and methacryloyl.

In this specification, a weight-average molecular weight and a number-average molecular weight are defined as values in terms of polystyrene measured by gel permeation chromatography (GPC). In this specification, an weight-average molecular weight (Mw) and a number-average molecular weight (Mn) can be obtained by using HLC-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

In this specification, in a chemical formula, Me represents a methyl group, Et represents an ethyl group, Bu represents a butyl group, and Ph represents a phenyl group.

Near infrared light denotes light (electromagnetic wave) having a maximum absorption wavelength in a range of 700 to 2500 nm.

In this specification, the term "step" denotes not only an individual step but also a step which is not clearly distinguishable from another step as long as an effect expected from the step can be achieved.

<Curable Composition>

A curable composition according to the present invention includes:
a near infrared absorbing compound that includes a cation having an absorption in a near infrared range and an anion;
a salt of an anion that is a component other than the near infrared absorbing compound and has a conjugate acid pKa of −8 or lower; and
a curable compound.

With the curable composition according to the present invention, a cured film having an absorption in a near infrared range and having excellent heat resistance can be manufactured. The mechanism of obtaining the effect is presumed to be as follows. In the near infrared absorbing compound that includes a cation (hereinafter, also referred to as "colorant cation") having an absorption in a near infrared range and an anion, the colorant cation tends to be easily affected. For example, the colorant cation may be separated from the anion due to an attack from a nucleophilic agent. For example, in a case where the cured film including the near infrared absorbing compound is heated to a high temperature, the component (for example water or a carboxylic acid) other than the near infrared absorbing compound that is present in the film functions as a nucleophilic agent such that the colorant cation tends to be easily affected. For example, the anion may be separated from the colorant cation in the near infrared absorbing compound, or a nucleophilic addition may occur in the colorant cation. Therefore, a near infrared absorbing compounds having a cation-anion structure tends to have low heat resistance in many cases. The curable composition according to the present invention further includes a salt of an anion having a conjugate acid pKa of −8 or lower in addition to the near infrared absorbing compound and the curable compound. Thus, it can be expected that the near infrared absorbing compound and the salt of the anion strongly interact with each other in the film. Therefore, it is presumed that an effect on the near infrared absorbing compound present in the film and a cation-anion structure of the near infrared absorbing compound derived from a component other than the salt of the anion is suppressed. Therefore, by using the curable composition according to the present invention, a cured film having excellent heat resistance can be manufactured.

In addition, the salt of the anion having a conjugate acid pKa has low solubility in a solvent in many cases, and the salt of the anion added tends to easily cause surface defects without being dissolved. The salt of the anion having a conjugate acid pKa of −8 or lower has excellent solubility in other components such as a solvent in the curable composition, and a cured film having an excellent surface shape can be manufactured.

Hereinafter, each of the components of the curable composition according to the present invention will be described.

<<Near Infrared Absorbing Compound>>

The curable composition according to the present invention includes a near infrared absorbing compound (hereinafter, also referred to as "near infrared absorbing compound A") that includes a cation (colorant cation) having an absorption in a near infrared range and an anion. In the near infrared absorbing compound A, the anion may be bonded to the colorant cation through a covalent bond or may be present outside a molecule of the colorant cation. It is preferable that the anion is present outside a molecule of the colorant cation. In a case where the near infrared absorbing compound A is a compound that includes the color cation and the anion present outside a molecule of the colorant cation, in particular, the effect of the present invention tends to be significant.

In addition, in the colorant cation, a cation structure is not particularly limited as long as it is present any portion of the colorant cation. That is, the cation structure may be present a portion having an absorption in a near infrared range, or may be present in a portion other than the portion having an absorption in a near infrared range.

In the present invention, the near infrared absorbing compound may be a pigment or a dye. A dye has low heat resistance in many cases, and in the case of a dye, the effect of the present invention is more significant.

In the present invention, the near infrared absorbing compound may be a pigment. In a case where the near infrared absorbing compound is used as a pigment, for example, a pigment which is obtained from the near infrared absorbing compound that includes the water-soluble colorant cation and the anion in an organic solvent can be used.

The near infrared absorbing compound A has a maximum absorption wavelength preferably in a range of 650 to 1300 nm, more preferably in a wavelength range of 660 to 1100 nm, still more preferably in a wavelength range of 670 to 1100 nm, and even still more preferably in a wavelength range of 710 to 1100 nm. In addition, it is preferable that the near infrared absorbing compound A is a compound not having a maximum absorption wavelength in a visible range.

In the near infrared absorbing compound A, a ratio A1/A2 of an absorbance A1 at a wavelength of 500 nm to an absorbance A2 at the maximum absorption wavelength is preferably 0.2 or lower and more preferably 0.1 or lower. According to this aspect, a cured film having excellent visible transparency and infrared shielding properties can be easily manufactured. The absorbance A1 at a wavelength of 500 nm and the absorbance A2 at the maximum absorption wavelength are values obtained from the absorption spectrum of the near infrared absorbing compound A in the solution.

It is preferable that the near infrared absorbing compound A is at least one selected from the group consisting of a cyanine compound and a diimmonium compound. In the present invention, the cyanine compound refers to a compound in which the colorant cation has a cyanine skeleton. In addition, the diimmonium compound refers to a compound in which the colorant cation has a diimmonium skeleton. It is preferable that the cyanine compound is a compound represented by Formula (A1) described below. In addition, it is preferable that the diimmonium compound is a compound represented by Formula (A2) described below.

The anion included in the near infrared absorbing compound A is not particularly limited. Examples of the anion include a fluorine anion, a chlorine anion, a bromine anion, an iodine anion, a cyanide ion, a perchlorate anion, a sulfonate anion, a carboxylate anion, a sulfonyl imide anion, a bis(sulfonyl)imide anion (preferably a bis(fluoroalkylsulfonyl)imide anion), a tris(sulfonyl)methide anion (preferably a tris(fluoroalkylsulfonyl)methide anion), a carboxylate anion, a tetraaryl borate anion, a tetracyanoborate anion, $PF_6^-$, $SbF_6^-$, and $CF_3SO^3$—. The anion is preferably a low nucleophilic anion. The low nucleophilic anion is an anion obtained by dissociation of a proton with an acid having a low pKa value generally called super acid. Although the definition thereof varies depending on documents, super acid is a generic term for acid having a lower pKa value than methanesulfonic acid. For example, a structure described in J. Org. Chem. 2011, 76, 391-395, Equilibrium Acidities of Super Acids is known. The conjugate acid pKa of the low nucleophilic anion is preferably −8 or lower, more preferably −11 or lower, and still more preferably −11 to −18. The pKa value can be measured using a method described in, for example, J. Org. Chem. 2011, 76, 391-395.

It is preferable that the anion having a conjugate acid pKa of −8 or lower is at least one selected from the group consisting of an anion having a partial structure represented by the following Formula (X1), an anion having a partial structure represented by the following Formula (X2), and an anion having a partial structure represented by the following Formula (X3),

(X1)

(X2)

(X3)

In Formula (X1), $R^{X1}$ and $R^{X2}$ each independently represent —$SO_2$— or —CO—;

in Formula (X2), $R^{X3}$ represents —$SO_2$— or —CO— and $R^{X4}$ and $R^{X5}$ each independently represent —$SO_2$—, —CO—, or a cyano group; and in Formula (X3), $R^{X6}$ to $R^{X9}$ each independently represent a halogen atom, an alkyl group, an aryl group, an alkoxy group, an aryloxy group, or a cyano group.

In Formula (X1), it is preferable that at least one of $R^{X1}$ or $R^{X2}$ represents —$SO_2$—, and it is more preferable that both $R^{X1}$ and $R^{X2}$ represent —$SO_2$—.

In the anion having the partial structure represented by (X1), it is preferable that a halogen atom or an alkyl group (haloalkyl group) having a halogen atom as a substituent is present at a terminal of at least one of $R^{X1}$ or $R^{X2}$, and it is more preferable that a fluorine atom or an alkyl group (fluoroalkyl group) having a fluorine atom as a substituent is present at a terminal of at least one of $R^{X1}$ or $R^{X2}$. The number of carbon atoms in the fluoroalkyl group is preferably 1 to 10, more preferably 1 to 6, and still more preferably 1 to 3.

In Formula (X2), it is preferable that at least one of $R^{X3}$, $R^{X4}$, or $R^{X5}$ represents —SO2-, it is more preferable that at least two of $R^{X3}$, $R^{X4}$, or $R^{X5}$ represents —SO2-, it is still more preferable that all of $R^{X3}$ to $R^{X5}$ represent —$SO_2$—, that $R^{X3}$ and $R^{X5}$ represent —$SO_2$— and $R^{X4}$ represents —CO—, or that $R^{X4}$ and $R^{X5}$ represent —$SO_2$— and $R^{X3}$ represents —CO—, and it is even still more preferable that all of $R^{X3}$ to $R^{X5}$ represent —$SO_2$—.

In the anion having the partial structure represented by (X2), it is preferable that a halogen atom or an alkyl group (haloalkyl group) having a halogen atom as a substituent is present at a terminal of at least one of $R^{X3}$, $R^{X4}$, or $R^{X5}$, and it is more preferable that a fluorine atom or an alkyl group (fluoroalkyl group) having a fluorine atom as a substituent is present at a terminal of at least one of $R^{X3}$, $R^{X4}$, or $R^{X5}$. In particular, it is preferable that a halogen atom or a haloalkyl group is present at terminals of at least two of $R^{X3}$, $R^{X4}$, or $R^{X5}$, and it is more preferable a fluorine atom or a fluoroalkyl group is present at terminals of at least two of $R^{X3}$, $R^{X4}$, or $R^{X5}$. The number of carbon atoms in the fluoroalkyl group is preferably 1 to 10, more preferably 1 to 6, and still more preferably 1 to 3. It is more preferable that the fluoroalkyl group is a perfluoroalkyl group.

In Formula (X3), $R^{X6}$ to $R^{X9}$ each independently represent a halogen atom, an alkyl group, an aryl group, an alkoxy group, an aryloxy group, or a cyano group. The alkyl group, the aryl group, the alkoxy group, and the aryloxy group may have a substituent, or may be unsubstituted. In a case where the alkyl group, the aryl group, the alkoxy group, and the aryloxy group may have a substituent, a halogen atom or an alkyl group which is substituted with a halogen atom is preferable, and a fluorine atom or an alkyl group which is substituted with a fluorine atom is preferable. In Formula (X3), it is preferable that at least one of $R^{X6}$, $R^{X7}$, $R^{X8}$, or $R^{X9}$ represents a cyano group, a halogen atom, an alkyl group having a halogen atom as a substituent, an aryl group having a halogen atom as a substituent, or an aryl group having an alkyl group which is substituted with a halogen atom as a substituent, and it is more preferable that all of $R^{X6}$ to $R^{X9}$ represent a cyano group or an aryl group having a halogen atom (preferably a fluorine atom) as a substituent.

It is preferable that the anion having the partial structure represented by Formula (X1) is an anion represented by the following Formula (X1-1). In addition, it is preferable that the anion having the partial structure represented by Formula (X2) is an anion represented by the following Formula (X2-1). That is, it is preferable that the anion is at least one selected from the group consisting of an anion represented by the following Formula (X1-1), an anion represented by the following Formula (X2-1), and an anion represented by the following Formula (X3).

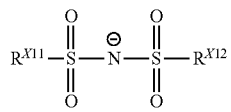

(X1-1)

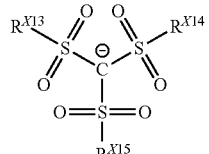

(X2-1)

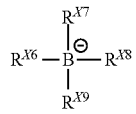

(X3)

In Formula (X1-1), $R^{X11}$ and $R^{X12}$ each independently represent a halogen atom or an alkyl group, and in a case where $R^{X11}$ and $R^{X12}$ each independently represent an alkyl group, $R^{X11}$ and $R^{X12}$ may be bonded to each other to form a ring;

in Formula (X2-1), $R^{X13}$ to $R^{X15}$ each independently represent a halogen atom or an alkyl group, and $RX^{13}$ and $RX^{14}$, $RX^{14}$ and $RX^{15}$, or $RX^{13}$ and $RX^{15}$ may be bonded to each other to form a ring; and in Formula (X3), $R^{X6}$ to $R^{X9}$ each independently represent a halogen atom, an alkyl group, an aryl group, an alkoxy group, an aryloxy group, or a cyano group.

In Formula (X1-1), $R^{X11}$ and $R^{X12}$ each independently represent a halogen atom or an alkyl group, in particular, a halogen atom is preferable.

Examples of the halogen atom include a fluorine atom, a chlorine atom, a bromine atom, and an iodine atom.

The number of carbon atoms in the alkyl group is preferably 1 to 10, more preferably 1 to 6, and still more preferably 1 to 3. The alkyl group is, for example, linear, branched, or cyclic, and is preferably linear or branched and more preferably linear. The alkyl group may have a substituent or may be unsubstituted. The alkyl group is preferably an alkyl group having a halogen atom as a substituent and an alkyl group (fluoroalkyl group) having a fluorine atom as a substituent. In addition, it is preferable that the fluoroalkyl group is a perfluoroalkyl group.

In a case where $R^{X11}$ and $R^{X12}$ in Formula (X1-1) each independently represent an alkyl group, $R^{X11}$ and $R^{X12}$ may be bonded to each other to form a ring.

In Formula (X2-1), $R^{X13}$ to $R^{X15}$ each independently represent a halogen atom or an alkyl group. The halogen atom and the alkyl group have the same ranges and the same preferable ranges as described above regarding Formula (X1-1).

In a case where $R^{X13}$ and $R^{X14}$ in Formula (X2-1) each independently represent an alkyl group, $R^{X13}$ and $R^{X14}$ may be bonded to each other to form a ring. In addition, in a case where $R^{X14}$ and $R^{X15}$ each independently represent an alkyl group, $R^{X14}$ and $R^{X15}$ may be bonded to each other to form a ring. In addition, in a case where $R^{X13}$ and $R^{X15}$ each independently represent an alkyl group, $R^{X13}$ and $R^{X15}$ may be bonded to each other to form a ring.

In the present invention, it is preferable that the anion is at least one selected from the group consisting of bis(fluoroalkylsulfonyl)imide, tris(fluoroalkylsulfonyl)methide, and tetracyanoborate. Specific preferable examples of the anion include anions represented by MD-1 to MD-19 described below regarding the salt of the anion having a conjugate acid pKa of −8 or lower.

(Cyanine Compound)

In the present invention, it is preferable that the near infrared absorbing compound A is a cyanine compound. It is preferable that the cyanine compound is a compound represented by the following Formula (A1).

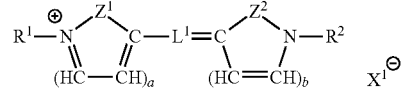

Formula (A1)

in Formula (A1), $Z^1$ and $Z^2$ each independently represent a non-metal atomic group for forming a 5- or 6-membered nitrogen-containing heterocycle which may be fused, $R^1$ and $R^2$ each independently represent an aliphatic group or an aromatic group, $L^1$ represents a methine chain including an odd number of methine groups, a and b each independently represent 0 or 1, and $X^1$ represents an anion.

In Formula (A1), $Z^1$ and $Z^2$ each independently represent a non-metal atomic group for forming a 5- or 6-membered nitrogen-containing heterocycle which may be fused. Another heterocycle, an aromatic ring, or an aliphatic ring may be fused to the nitrogen-containing heterocycle. It is preferable that the nitrogen-containing heterocycle is a 5-membered ring. A structure in which a benzene ring or a naphthalene ring is fused to the 5-membered nitrogen-containing heterocycle is more preferable. Specific examples of the nitrogen-containing heterocycle include an oxazole ring, an isoxazole ring, a benzoxazole ring, a naphthoxazole ring, an oxazolocarbazole ring, an oxazolodibenzofuran ring, a thiazole ring, a benzothiazole ring, a naphthothiazol ring, an indolenine ring, a benzoindolenine ring, an imidazole ring, a benzimidazole ring, a naphthoimidazole ring, a quinoline ring, a pyridine ring, a pyrrolopyridine ring, a furopyrrole ring, an indolizine ring, an imidazoquinoxaline ring, and a quinoxaline ring. Among these, a quinoline ring, an indolenine ring, a benzoindolenine ring, a benzoxazole ring, a benzothiazole ring, or a benzimidazole ring is preferable, and an indolenine ring, a benzothiazole ring, or a benzimidazole ring is more preferable. The nitrogen-containing heterocycle and a ring fused thereto may have a substituent. Examples of the substituent include groups described below regarding the substituent T.

(Substituent T)

The substituent group T includes a halogen atom, a cyano group, a nitro group, an alkyl group, an alkenyl group, an alkynyl group, an aryl group, a heteroaryl group, an aralkyl group, —OR$^{Z1}$, —COR$^{Z2}$, —COOR$^{Z3}$, —OCOR$^{Z4}$, —NR$^{Z5}$R$^{Z6}$, —NHCOR$^{Z7}$, —CONR$^{Z8}$R$^{Z9}$, —NHCONR$^{Z10}$R$^{Z11}$, —NHCOOR$^{Z12}$, —SR$^{Z13}$—, —SO$_2$R$^{Z14}$, —SO$_2$OR$^{Z15}$—, —NHSO$_2$R$^{Z16}$, and —SO$_2$NR$^{Z17}$R$^{Z18}$. R$^{Z1}$ to R$^{Z18}$ each independently represent a hydrogen atom, an alkyl group, an alkenyl group, an alkynyl group, an aryl group, a heteroaryl group, or an aralkyl group. In a case where R$^{Z3}$ in —COOR$^{Z3}$ represents a hydrogen atom (that is, a carboxyl group), the hydrogen atom may be dissociable or may be in the form of a salt. In a case where R$^{Z15}$ in —SO$_2$OR$^{Z15}$ represents a hydrogen atom (that is, a sulfo group), the hydrogen atom may be dissociable or may be in the form of a salt.

Examples of the halogen atom include a fluorine atom, a chlorine atom, a bromine atom, and an iodine atom.

The number of carbon atoms in the alkyl group is preferably 1 to 20, more preferably 1 to 15, and still more preferably 1 to 8. The alkyl group may be linear, branched, or cyclic and is preferably linear or branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group is preferably 6 to 30, more preferably 6 to 20, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5-membered or 6-membered ring. The number of carbon atoms constituting the ring of the heteroaryl group is preferably 3 to 30, more preferably 3 to 18, and still more preferably 3 to 12. Examples of the heteroaryl group include a pyridine ring, a piperidine ring, a furan ring group, a furfuran ring, a thiophene ring, a pyrrole ring, a quinoline ring, a morpholine ring, an indole ring, an imidazole ring, a pyrazole ring, a carbazole ring, a phenothiazine ring, a phenoxazine ring, an indoline ring, a thiazole ring, a pyrazine ring, a thiadiazine ring, a benzoquinoline ring, and a thiadiazole ring.

The alkyl group, the alkenyl group, the alkynyl group, the aralkyl group, the aryl group, and the heteroaryl group may have a substituent or may be unsubstituted. Examples of the substituent include the groups described regarding the substituent T.

In Formula (A1), R$^1$ and R$^2$ each independently represent an aliphatic group or an aromatic group, preferably an alkyl group, an alkenyl group, an alkynyl group, an aralkyl group, or an aryl group, and more preferably an alkyl group.

The number of carbon atoms in the alkyl group is preferably 1 to 20, more preferably 1 to 12, and still more preferably 1 to 8. The alkyl group may be linear, branched, or cyclic.

The number of carbon atoms in the alkenyl group is preferably 2 to 20, more preferably 2 to 12, and still more preferably 2 to 8. The alkenyl group may be linear, branched, or cyclic.

The number of carbon atoms in the alkynyl group is preferably 2 to 20, more preferably 2 to 12, and still more preferably 2 to 8. The alkynyl group may be linear, branched, or cyclic.

The number of carbon atoms in the aryl group is preferably 6 to 25, more preferably 6 to 15, and still more preferably 6 to 10.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The alkyl group, the alkenyl group, the alkynyl group, the aralkyl group, and the aryl group may have a substituent or may be unsubstituted. Examples of the substituent include the groups described regarding the substituent T. Among these, a halogen atom, a hydroxyl group, a carboxyl group, a sulfo group, an alkoxy group, or an aryloxy group is preferable, and an alkoxy group or an aryloxy group is more preferable.

In Formula (A1), L$^1$ represents a methine chain including an odd number of methine groups. It is preferable that L$^1$ represents a methine chain including 3, 5, or 7 methine groups.

The methine group may have a substituent, and the methine chain may have a substituent. It is preferable that the methine group having a substituent is a methine group positioned at the center (meso position). Specific examples of the substituent include the groups described regarding the substituent T, and a group represented by the following Formula (a). In addition, two substituents in the methine chain may be bonded to each other to form a 5-membered or 6-membered ring.

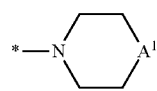

(a)

In Formula (a), * represents a linking portion to the methine chain, and $A^1$ represents an oxygen atom or a sulfur atom.

In Formula (A1), a and b each independently represent 0 or 1. In a case where a represents 0, a carbon atom and a nitrogen atom are bonded through a double bond. In a case where b represents 0, a carbon atom and a nitrogen atom are bonded through a single bond. It is preferable that both a and b represent 0. In a case where both a and b represent 0, Formula (A1) will be shown below.

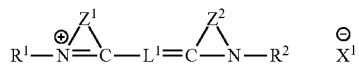

In Formula (A1), $X^1$ represents an anion. Examples of the anion include the anions described above regarding the near infrared absorbing compound A, and preferable ranges thereof are also the same.

It is preferable that the cyanine compound is a compound represented by any one of the following Formulae (A1-1) to (A1-3).

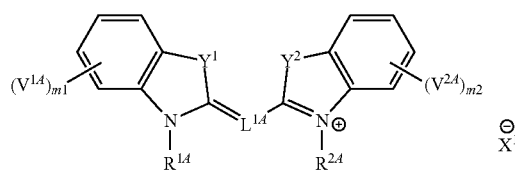
(A1-1)

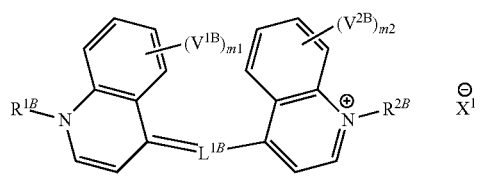
(A1-2)

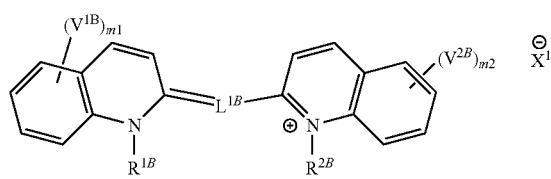
(A1-3)

In the formulae, $R^{1A}$, $R^{2A}$, $R^{1B}$, and $R^{2B}$ each independently represent an alkyl group, an alkenyl group, an alkynyl group, an aralkyl group, or an aryl group.

$L^{1A}$ and $L^{1B}$ each independently represent a methine chain including an odd number of methine groups.

$Y^1$ and $Y^2$ each independently represent —S—, —O—, —NR$^{X1}$— or, —CR$^{X2}$R$^{X3}$—.

$R^{X1}$, $R^{X2}$, and $R^{X3}$ each independently represent a hydrogen atom or an alkyl group, and $R^{X2}$ and $R^{X3}$ may be bonded to each other to form a ring.

$V^{1A}$, $V^{2A}$, $V^{1B}$, and $V^{2B}$ each independently represent a substituent.

m1 and m2 each independently represent 0 to 4.

$X^1$ represents an anion.

The groups represented by $R^{1A}$, $R^{2A}$, $R^{1B}$, and $R^{2B}$ have the same definitions and the same preferable ranges as those of the alkyl group, the alkenyl group, the alkynyl group, the aralkyl group, and the aryl group described regarding $R^1$ and $R^2$ of Formula (A1). These groups may be unsubstituted or may have a substituent. Examples of the substituent include the groups described regarding the substituent T. Among these, a halogen atom, a hydroxyl group, a carboxyl group, a sulfo group, an alkoxy group, or an aryloxy group is preferable, and an alkoxy group or an aryloxy group is more preferable.

$Y^1$ and $Y^2$ each independently represent —S—, —O—, —NR$^{X1}$— or, —CR$^{X2}$R$^{X3}$— and preferably —NR$^{X1}$—. $R^{X1}$, $R^{X2}$, and $R^{X3}$ each independently represent a hydrogen atom or an alkyl group and preferably an alkyl group. The number of carbon atoms in the alkyl group is preferably 1 to 10, more preferably 1 to 5, and still more preferably 1 to 3. The alkyl group may be linear, branched, or cyclic and is preferably linear or branched and more preferably linear. The alkyl group may have a substituent or may be unsubstituted. Examples of the substituent include the groups described regarding the substituent T. Among these, a halogen atom or an aryl group is preferable.

$R^{X2}$ and $R^{X3}$ may be bonded to each other to form a ring. It is preferable that the ring is a cycloalkyl ring.

$L^{1A}$ and $L^{1B}$ have the same definitions and the same preferable ranges as those of $L^1$ in Formula (A1).

Examples of the substituent represented by $V^{1A}$, $V^{2A}$, $V^{1B}$, and $V^{2B}$ include the groups described regarding the substituent T. Among these, a halogen atom, an alkyl group, an aryl group, an alkoxy group, or an aryloxy group is preferable.

m1 and m2 each independently represent 0 to 4 and preferably 0 to 2.

The anion represented by $X^1$ have the same range and definitions and the same preferable ranges as those described regarding $X^1$ in Formula (A1).

Specific examples of the cyanine compound include the following compounds. Other examples of the cyanine compound include compound described in JP2015-172004A and JP2015-172102A. In the following description, Me represents a methyl group, Et represents an ethyl group, Bu represents a butyl group, Bn represents a benzyl group, and Ph represents a phenyl group. In addition, numerical values added to structural formulae in the tables represent binding sites of $V^1$ and $V^2$.

TABLE 1

| X | R$^1$ | R$^2$ | V$^1$ | m |
|---|---|---|---|---|
| S-1 | S | Et | H | — | 0 |
| S-2 | O | Et | Me | — | 0 |
| S-3 | N-Et | Et | H | 5:Cl 6:Cl | 2 |
| S-4 | S | n-Bu | Bn | 5:Cl | 1 |

TABLE 2

| | $R^1$ | $R^2$ | $V^1$ | m |
|---|---|---|---|---|
| S-5 | Et | H | — | 0 |
| S-6 | Et | Me | — | 0 |
| S-7 | Et | Bn | 6:Cl 7:Cl | 2 |
| S-8 | n-Bu | Bn | 6:Cl | 1 |

TABLE 3

| | X | $R^1$ | $R^2$ | $R^3$ | $V^1$ | m |
|---|---|---|---|---|---|---|
| S-9 | S | Et | H | H | — | 0 |
| S-10 | O | Et | H | Me | — | 0 |
| S-11 | S | Et | Me | Me | 5:MeO | 1 |
| S-12 | S | n-Bu | H | Ph | 5:Cl | 1 |

TABLE 4

| | X | $R^1$ | $R^2$ | $V^1$ | m1 | $V^2$ | m2 |
|---|---|---|---|---|---|---|---|
| S-13 | S | Et | H | — | 0 | — | 0 |
| S-14 | O | Et | H | 5:Cl | 1 | — | 0 |
| S-15 | S | Et | Me | 5:MeO | 1 | 5:MeO | 1 |
| S-16 | S | n-Bu | Bn | 5:Cl | 1 | 5:Cl | 1 |

TABLE 5
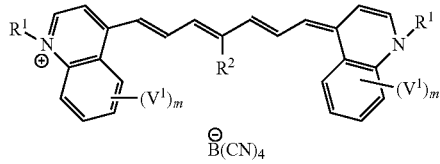
| | R¹ | R² | V¹ | m |
|---|---|---|---|---|
| S-17 | Et | H | — | 0 |
| S-18 | Et | Me | — | 0 |
| S-19 | Et | Bn | 6:Cl 7:Cl | 2 |
| S-20 | n-Bu | Bn | 6:Cl | 1 |
TABLE 6
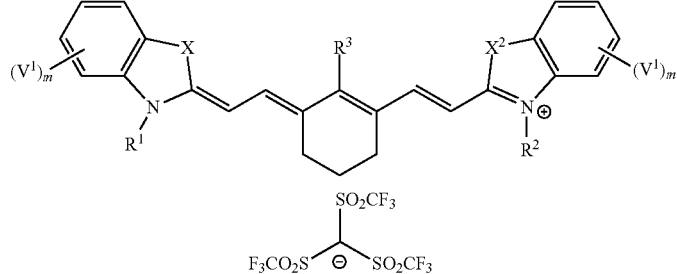
| | X | R¹ | R² | R³ | V¹ | m |
|---|---|---|---|---|---|---|
| S-21 | S | Et | Et | H | — | 0 |
| S-22 | O | Et | Et | Cl | — | 0 |
| S-23 | S | n-Bu | n-Bu | H | 5:MeO | 1 |
| S-24 | S | Et | Et | Ph | 5:Cl | 1 |
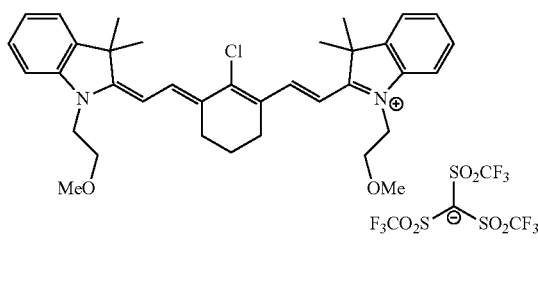
S-25
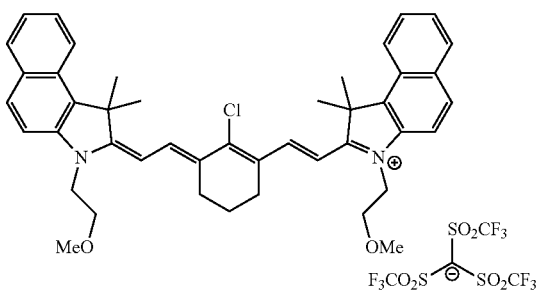
S-26
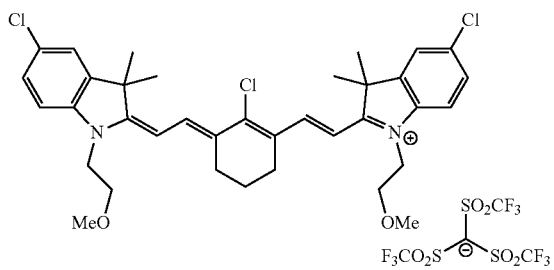
S-27
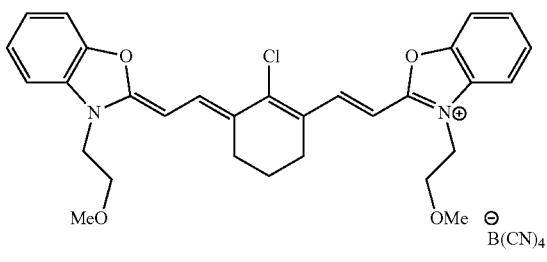
S-28

-continued
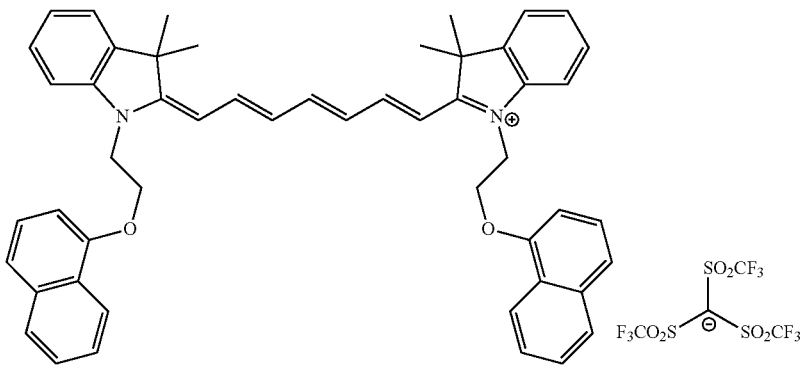
S-29
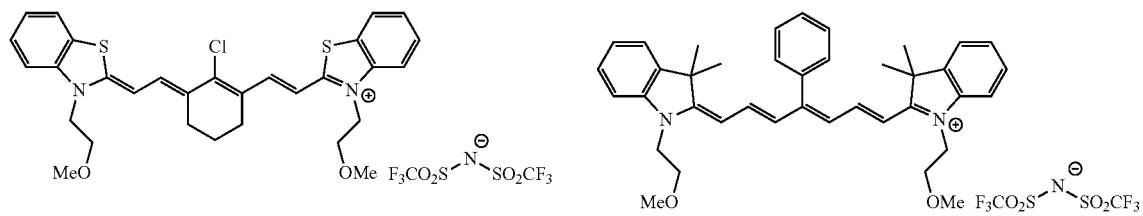
S-30  S-31
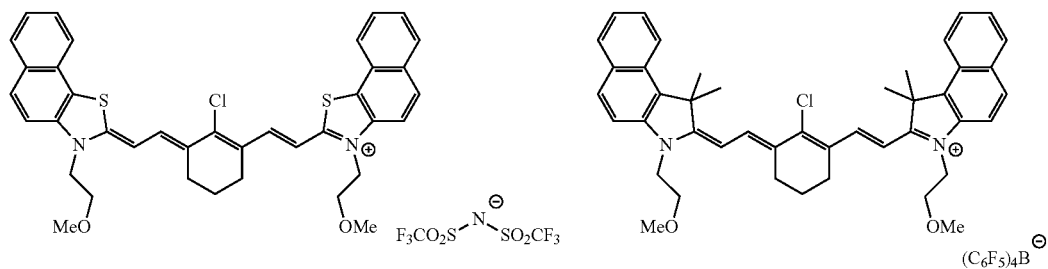
S-32  S-33
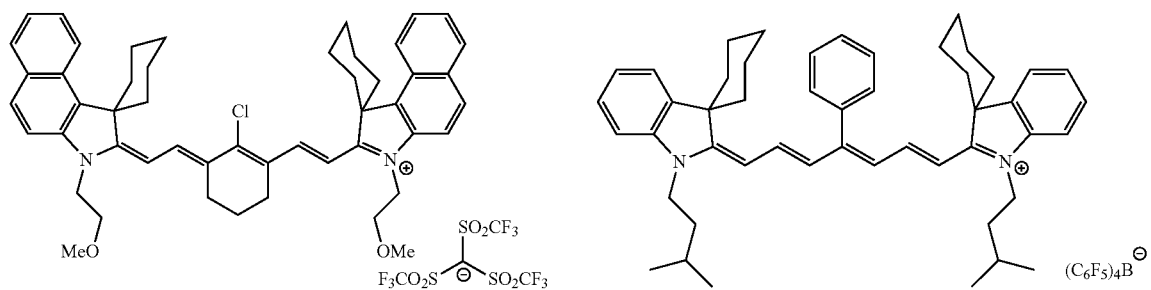
S-34  S-35
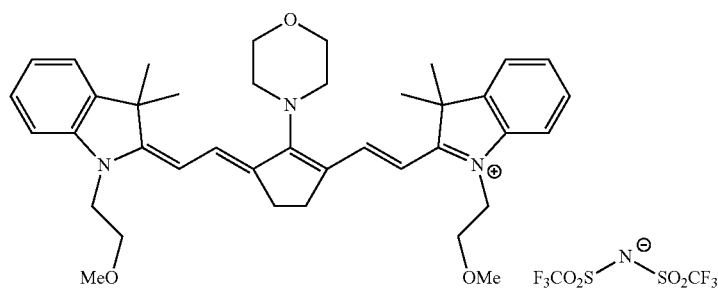
S-36

-continued
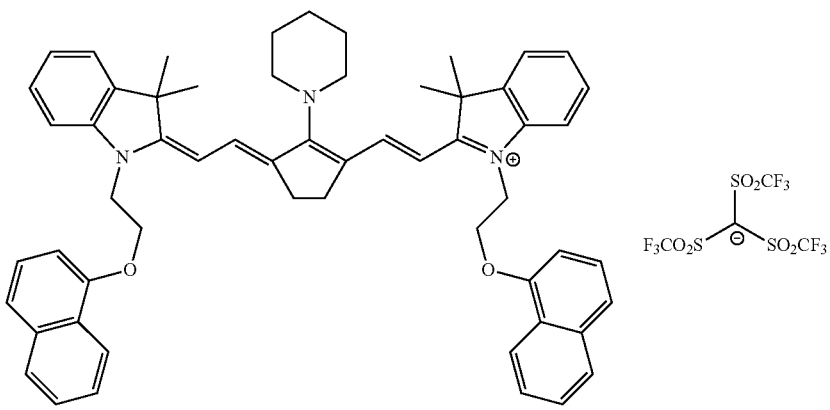
S-37
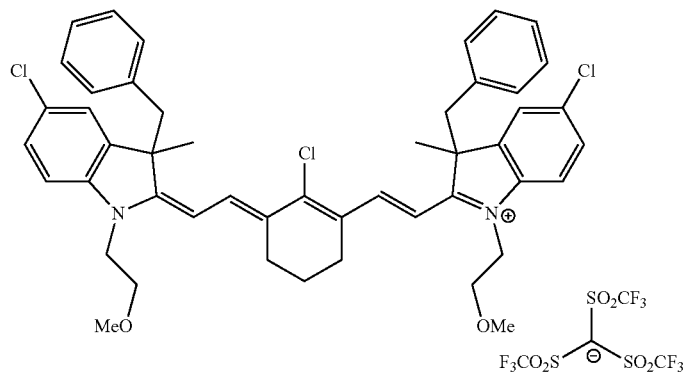
S-38
TABLE 7
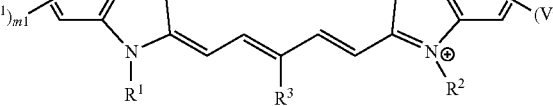
| | R¹ | R² | R³ | V¹ | m1 | V² | m2 |
|---|---|---|---|---|---|---|---|
| I-1 | Et | Et | H | — | 0 | — | 0 |
| I-2 | CH₂CH₂OMe | CH₂CH₂OMe | H | — | 0 | — | 0 |
I-3
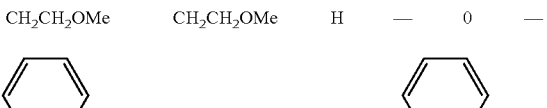
| | | | | | | | |
|---|---|---|---|---|---|---|---|
| I-4 | Et | Et | Me | 5:Cl | 1 | 5:Cl | 1 |

TABLE 8

| | R¹ | R² | R³ | V¹ | m1 | V² | m2 |
|---|---|---|---|---|---|---|---|
| I-5 | Et | Et | H | — | 0 | — | 0 |
| I-6 | CH₂CH₂OMe | CH₂CH₂OMe | H | — | 0 | — | 0 |
| I-7 | | | | | | | |
| I-8 | Et | Et | Me | 5:Cl | 1 | 5:Cl | 1 |

TABLE 9

| | R¹ | R² | R³ | V¹ | m1 | V² | m2 |
|---|---|---|---|---|---|---|---|
| I-9 | Et | Et | H | — | 0 | — | 0 |
| I-10 | CH₂CH₂OMe | CH₂CH₂OMe | H | — | 0 | — | 0 |
| I-11 | | | | | | | |
| I-12 | Et | Et | Cl | 6:MeO | 1 | 6:MeO | 1 |

(Diimmonium Compound)

In the present invention, it is preferable that the near infrared absorbing compound A is a diimmonium compound. It is preferable that the diimmonium compound is a compound represented by the following Formula (A2).

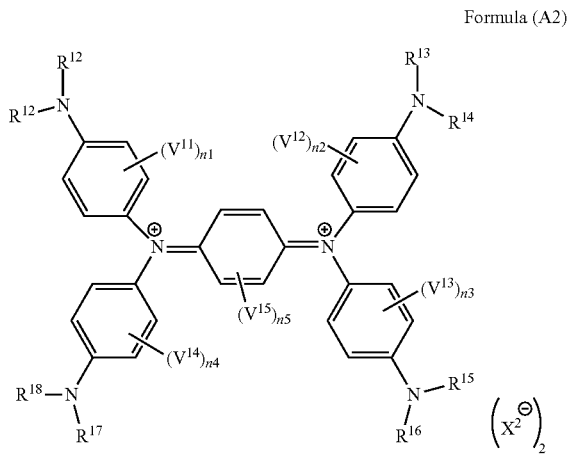

Formula (A2)

In Formula (A2), $R^{11}$ to $R^{18}$ each independently represent an alkyl group or an aryl group.

$V^{11}$ to $V^{15}$ each independently represent an alkyl group, an aryl group, a halogen atom, an alkoxy group, or a cyano group, $X^2$ represents an anion, and n1 to n5 each independently represent an integer of 0 to 4.

$R^{11}$ to $R^{18}$ each independently represent an alkyl group or an aryl group.

The number of carbon atoms in the alkyl group is preferably 1 to 20, more preferably 1 to 12, and still more preferably 1 to 8. The alkyl group may be linear, branched, or cyclic and is preferably linear or branched and more preferably linear.

The number of carbon atoms in the aryl group is preferably 6 to 25, more preferably 6 to 15, and still more preferably 6 to 12.

The alkyl group and the aryl group may have a substituent or may be unsubstituted. Examples of the substituent include the groups described regarding the substituent T. Among these, a halogen atom, an alkyl group, an aryl group, an alkoxy group, or an aryloxy group is preferable.

$V^{11}$ to $V^{15}$ each independently represent an alkyl group, an aryl group, a halogen atom, an alkoxy group, or a cyano group.

Examples of the halogen atom include a fluorine atom, a chlorine atom, a bromine atom, and an iodine atom.

The number of carbon atoms in the alkyl group is preferably 1 to 20, more preferably 1 to 12, and still more preferably 1 to 8. The alkyl group may be linear, branched, or cyclic and is preferably linear or branched and more preferably linear.

The number of carbon atoms in the aryl group is preferably 6 to 25, more preferably 6 to 15, and still more preferably 6 to 12.

The number of carbon atoms in the alkoxy group is preferably 1 to 20, more preferably 1 to 12, and still more preferably 1 to 8. The alkoxy group may be linear, branched, or cyclic and is preferably linear or branched and more preferably linear.

The alkyl group, the aryl group, and the alkoxy group represented by $V^{11}$ to $V^{15}$ may have a substituent, or may be unsubstituted. Examples of the substituent include the groups described regarding the substituent T. Among these, a halogen atom, an alkyl group, an aryl group, an alkoxy group, or an aryloxy group is preferable.

n1 to n5 each independently 0 to 4. n1 to n4 represents preferably 0 to 2 and more preferably 0 or 1. n5 represents preferably 0 to 3 and more preferably 0 to 2.

$X^2$ represents an anion. Examples of the anion include the anions described above regarding the near infrared absorbing compound A, and preferable ranges thereof are also the same.

Specific examples of the compound represented by Formula (A2) will be shown as follows. In the following tables, Me represents a methyl group, Et represents an ethyl group, Bu represents a butyl group, and Ph represents a phenyl group.

TABLE 10

| | $R^1$ | $R^2$ | $R^3$ | $X^2$ |
|---|---|---|---|---|
| D-1 | n-Bu | H | H | MD-1 |
| D-2 | n-Bu | H | H | MD-8 |
| D-3 | i-Bu | H | H | MD-1 |
| D-4 | i-Bu | H | H | MD-2 |
| D-5 | i-Bu | H | H | MD-8 |
| D-6 | i-Bu | H | H | MD-9 |
| D-7 | i-Bu | H | H | MD-14 |
| D-8 | i-Bu | H | H | MD-15 |
| D-9 | i-Bu | H | H | $CF_3SO_3^-$ |
| D-10 | n-$C_6H_{13}$ | H | H | MD-1 |
| D-12 | $CH_2CHEtC_4H_9$ | H | H | MD-8 |
| D-12 | $CH_2Ph$ | H | H | MD-14 |
| D-13 | Ph | H | H | MD-1 |
| D-14 | i-Bu | Me | H | MD-1 |
| D-15 | i-Bu | H | Me | MD-8 |
| D-16 | i-Bu | Cl | CN | MD-8 |

In the tables, MD-1, MD-2, MD-8, MD-9, MD-14, and MD-15 represent anions having the following structures.

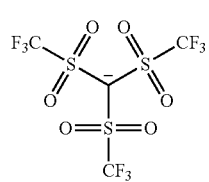

(MD-1)

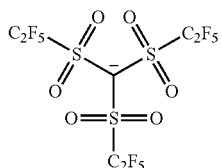

(MD-2)

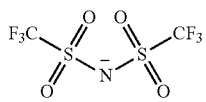

(MD-8)

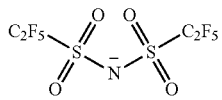

(MD-9)

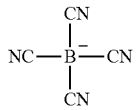

(MD-14)

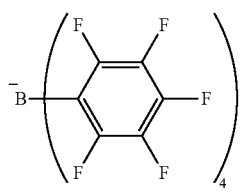

(MD-15)

In the curable composition according to the present invention, the content of the near infrared absorbing compound A is preferably 0.1 to 70 mass % with respect to the total solid content of the curable composition according to the present invention. The lower limit is preferably 0.5 mass % or higher and more preferably 1.0 mass % or higher. The upper limit is preferably 60 mass % or lower, and more preferably 50 mass % or lower. In the above-described range, excellent infrared absorption capacity can be imparted. As the near infrared absorbing compound A, one kind may be used alone, or two or more kinds may be used. In a case where the curable composition according to the present invention includes two or more near infrared absorbing compounds A, it is preferable that the total content of the two or more near infrared absorbing compounds A is in the above-described range.

<Salt of Anion Having Conjugate Acid pKa of −8 or Lower>

The curable composition according to the present invention includes a salt of an anion having a conjugate acid pKa of −8 or lower (hereinafter, also referred to as "the salt of the low nucleophilic anion"). The salt of the low nucleophilic anion is a component other than the near infrared absorbing compound. That is, the salt of the low nucleophilic anion according to the present invention is a compound that does not include a colorant cation having an absorption maximum in a near infrared range.

The conjugate acid pKa of the anion in the salt of the low nucleophilic anion is preferably −8 or lower, more preferably −11 or lower, and still more preferably −11 to −18.

It is preferable that the salt of the low nucleophilic anion is a compound not having a maximum absorption wavelength in a visible range (preferably in a wavelength range of 400 to 550 nm). According to this aspect, there is no effect on the color of the near infrared absorbing compound A in a visible range, and a cured film having excellent heat resistance can be manufactured.

The salt of the low nucleophilic anion may be a polymer type compound including a repeating unit. However, it is preferable that the salt of the low nucleophilic anion is a compound not including a repeating unit because the effect of the present invention can be more easily exhibited. In addition, it is preferable that the salt of the low nucleophilic anion is a compound not having a molecular weight distribution. In addition, the molecular weight of the salt of the low nucleophilic anion is preferably 100 to 2000.

Regarding the salt of the low nucleophilic anion, a cation (counter cation) paired with the low nucleophilic anion is not particularly limited as long as it has a structure that can counterbalance the charge of the low nucleophilic anion. It is preferable that the counter cation is a cation that has a structure not having a chromophore. In addition, it is preferable that the counter cation is a cation that has a structure not having an absorption maximum in a visible range (preferably in a wavelength range of 400 to 550 nm). In addition, the molecular weight of the counter cation is preferably 10 to 1000, more preferably 10 to 500, and still more preferably 10 to 400. In particular, the counter cation is preferably a monovalent or divalent metal cation or an ammonium cation and more preferably a monovalent metal cation or an ammonium cation. As the monovalent or divalent metal cation, a Li cation, a Na cation, a K cation, a Rb cation, a Cs cation, a Ca cation, a Mg cation, a Sr cation, or a Ba cation is preferable, a Li cation, a Na cation, a K cation, a Ca cation, a Mg cation, is more preferable, and a Li cation, a Na cation, a K cation, is still more preferable.

Examples of the ammonium cation include a $NR^B_4$ cation. Examples of $R^B$ include a hydrogen atom, an alkyl group, and an aryl group. A plurality of $R^B$'s may be the same as or different from each other. Two $R^B$'s may be bonded to each other to form a ring.

The number of carbon atoms in the alkyl group represented by $R^B$ is preferably 1 to 20, more preferably 1 to 10, and still more preferably 1 to 5. The alkyl group may be linear, branched, or cyclic and is preferably linear or branched and more preferably linear. The alkyl group may be unsubstituted or may have a substituent. Examples of the substituent include a halogen atom and an aryl group.

The number of carbon atoms in the aryl group represented by $R^B$ is preferably 6 to 25, more preferably 6 to 15, and still more preferably 6 to 12. The aryl group may be unsubstituted or may have a substituent. Examples of the substituent include a halogen atom and an alkyl group.

Specific preferable examples of the ammonium cation include $NH_4^+$ (ammonium cation), a tetramethylammonium cation, a tetraethylammonium cation, a tetrabutylammonium cation, a benzyltrimethylammonium cation, and a benzyltriethylammonium cation.

In the present invention, it is preferable that the salt of the low nucleophilic anion is at least one selected from the group consisting of a salt of an anion having a partial structure represented by the following Formula (B1), a salt of an anion having a partial structure represented by the following Formula (B2), and a salt of an anion represented by the following Formula (B3).

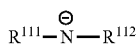
(B1)

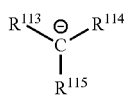
(B2)

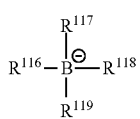
(B3)

In Formula (B1), $R^{111}$ and $R^{112}$ each independently represent $-SO_2-$ or $-CO-$;

in Formula (B2), $R^{113}$ represents $-SO_2-$ or $-CO-$ and $R^{114}$ and $R^{115}$ each independently represent $-SO_2-$, $-CO-$, or a cyano group; and in Formula (B3), $R^{116}$ to $R^{119}$ each independently represent a halogen atom, an alkyl group, an aryl group, an alkoxy group, an aryloxy group, or a cyano group.

In Formula (B1), it is preferable that at least one of $R^{111}$ or $R^{112}$ represents $-SO_2-$, and it is more preferable that both $R^{111}$ and $R^{112}$ represent $-SO_2-$.

In the anion having the partial structure represented by (B1), it is preferable that a halogen atom or an alkyl group (haloalkyl group) having a halogen atom as a substituent is present at a terminal of at least one of $R^{111}$ or $R^{112}$, and it is more preferable that a fluorine atom or an alkyl group (fluoroalkyl group) having a fluorine atom as a substituent is present at a terminal of at least one of $R^{111}$ or $R^{112}$. The number of carbon atoms in the fluoroalkyl group is preferably 1 to 10, more preferably 1 to 6, and still more preferably 1 to 3. It is more preferable that the fluoroalkyl group is a perfluoroalkyl group.

In Formula (B2), it is preferable that at least one of $R^{113}$, $R^{114}$, or $R^{115}$ represents $-SO_2-$, it is more preferable that at least two of $R^{113}$, $R^{114}$, or $R^{115}$ represents $-SO_2-$, it is still more preferable that all of $R^{113}$ to $R^{115}$ represent $-SO_2-$, that $R^{113}$ and $R^{115}$ represent $-SO_2-$ and $R^{114}$ represents $-CO-$, or that $R^{114}$ and $R^{115}$ represent $-SO_2-$ and $R^{113}$ represents $-CO-$, and it is even still more preferable that all of $R^{113}$ to $R^{115}$ represent $-SO_2-$.

In the anion having the partial structure represented by (B2), it is preferable that a halogen atom or an alkyl group (haloalkyl group) having a halogen atom as a substituent is present at a terminal of at least one of $R^{113}$, $R^{114}$, or $R^{115}$, and it is more preferable that a fluorine atom or an alkyl group (fluoroalkyl group) having a fluorine atom as a substituent is present at a terminal of at least one of $R^{113}$, $R^{114}$, or $R^{115}$. In particular, it is preferable that a halogen atom or a haloalkyl group is present at terminals of at least two of $R^{113}$, $R^{114}$, or $R^{115}$, and it is more preferable a fluorine atom or a fluoroalkyl group is present at terminals of at least two of $R^{113}$, $R^{114}$, or $R^{115}$. The number of carbon atoms in the fluoroalkyl group is preferably 1 to 10, more preferably 1 to 6, and still more preferably 1 to 3. It is more preferable that the fluoroalkyl group is a perfluoroalkyl group.

In Formula (B3), $R^{116}$ to $R^{119}$ each independently represent a halogen atom, an alkyl group, an aryl group, an alkoxy group, an aryloxy group, or a cyano group. The alkyl group, the aryl group, the alkoxy group, and the aryloxy group may have a substituent, or may be unsubstituted. In a case where the alkyl group, the aryl group, the alkoxy group, and the aryloxy group may have a substituent, a halogen atom or an alkyl group which is substituted with a halogen atom is preferable, and a fluorine atom or an alkyl group which is substituted with a fluorine atom is preferable. In Formula (B3), it is preferable that at least one of $R^{116}$, $R^{117}$, $R^{118}$, or $R^{119}$ represents a cyano group, a halogen atom, an alkyl group having a halogen atom as a substituent, an aryl group having a halogen atom as a substituent, or an aryl group having an alkyl group which is substituted with a halogen atom as a substituent, and it is more preferable that all of $R^{116}$ to $R^{119}$ represent a cyano group or an aryl group having a halogen atom (preferably a fluorine atom) as a substituent.

It is preferable that the salt of the anion having the partial structure represented by Formula (B1) is a salt of an anion represented by the following Formula (B1-1). In addition, it is preferable that the salt of the anion having the partial structure represented by Formula (B2) is a salt of an anion represented by the following Formula (B2-1). That is, it is preferable that the salt of the low nucleophilic anion is at least one selected from the group consisting of a salt of an anion represented by the following Formula (B1-1), a salt of an anion represented by the following Formula (B2-1), and a salt of an anion represented by the following Formula (B3).

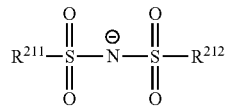
(B1-1)

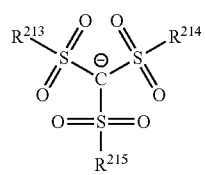
(B2-1)

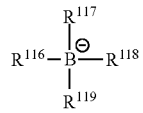
(B3)

In Formula (B1-1), $R^{211}$ and $R^{212}$ each independently represent a halogen atom or an alkyl group;

in Formula (B2-1), $R^{213}$ to $R^{215}$ each independently represent a halogen atom or an alkyl group; and in Formula (B3), $R^{116}$ to $R^{119}$ each independently represent a halogen atom, an alkyl group, an aryl group, an alkoxy group, an aryloxy group, or a cyano group.

It is preferable that $R^{211}$ and $R^{212}$ represent a halogen atom. Examples of the halogen atom represented by $R^{211}$ and $R^{212}$ include a fluorine atom, a chlorine atom, a bromine atom, and an iodine atom.

The number of carbon atoms in the alkyl group represented by $R^{211}$ and $R^{212}$ is preferably 1 to 10, more preferably 1 to 6, and still more preferably 1 to 3. The alkyl group is, for example, linear, branched, or cyclic, and is preferably linear or branched and more preferably linear. The alkyl group may have a substituent or may be unsubstituted. The alkyl group is preferably an alkyl group bonded to a halogen atom and more preferably an alkyl group (fluoroalkyl group) bonded to a fluorine atom. In addition, it is preferable that the fluoroalkyl group is a perfluoroalkyl group.

In a case where $R^{211}$ and $R^{212}$ in Formula (B1-1) each independently represent an alkyl group, $R^{211}$ and $R^{212}$ may be bonded to each other to form a ring.

In Formula (B2-1), $R^{213}$ to $R^{215}$ each independently represent a halogen atom or an alkyl group. The halogen atom and the alkyl group have the same ranges and the same preferable ranges as described above regarding Formula (B1-1).

In a case where $R^{213}$ and $R^{214}$ in Formula (B2-1) each independently represent an alkyl group, $R^{213}$ and $R^{214}$ may be bonded to each other to form a ring. In addition, in a case where $R^{214}$ and $R^{215}$ each independently represent an alkyl group, $R^{214}$ and $R^{215}$ may be bonded to each other to form a ring. In addition, in a case where $R^{213}$ and $R^{215}$ each independently represent an alkyl group, $R^{213}$ and $R^{215}$ may be bonded to each other to form a ring.

In the present invention, it is preferable that the salt of the low nucleophilic anion is at least one selected from the group consisting of a bis(fluoroalkylsulfonyl)imide salt, a tris(fluoroalkylsulfonyl)methide salt, and a tetracyanoborate salt. According to this aspect, the heat resistance of the cured film can be further improved. In addition, the salt of the low nucleophilic anion has excellent solubility in another component (for example, a solvent) of the curable composition, and thus the surface shape of the obtained cured film can be improved.

Specific examples of the salt of the low nucleophilic anion include compounds that include the following anions and the counter cations. As the salt of the low nucleophilic anion, W-1 to W-13 described below regarding Examples are preferable, and W-1, W-2, W-3, W-4, W-8, W-9, W-10, or W-11 is more preferable.

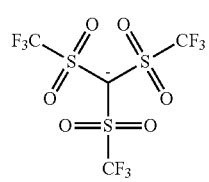

(MD-1)

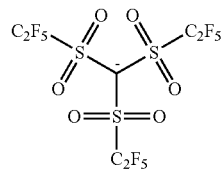

(MD-2)

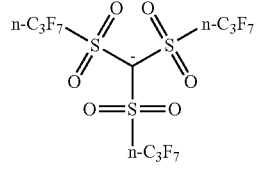

(MD-3)

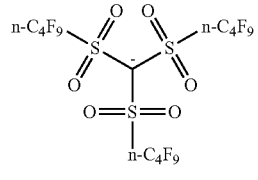

(MD-4)

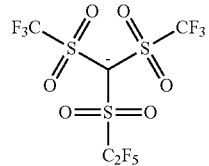

(MD-5)

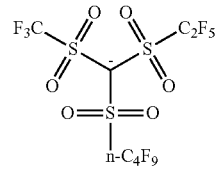

(MD-6)

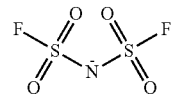

(MD-7)

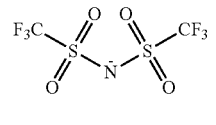

(MD-8)

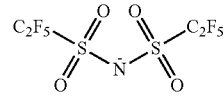

(MD-9)

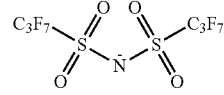

(MD-10)

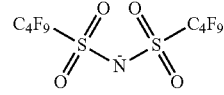

(MD-11)

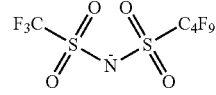

(MD-12)

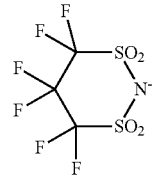

(MD-13)

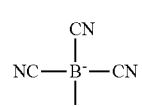

(MD-14)

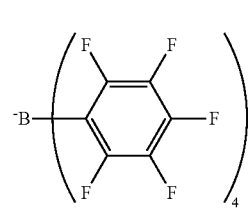

(MD-15)

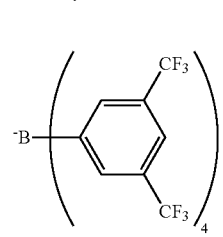

(MD-16)

-continued (MD-17)

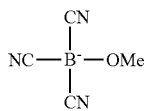

(MD-18)

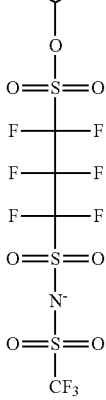

(MD-19)

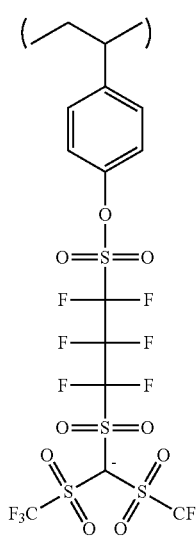

In the curable composition according to the present invention, the content of the salt of the low nucleophilic anion is preferably 0.05 to 5 mol with respect to 1 mol of the near infrared absorbing compound A. The upper limit is preferably 4 mol or lower and more preferably 3 mol or lower. The lower limit is preferably 0.10 mol or higher and more preferably 0.20 mol or higher. By adjusting the content of the salt of the low nucleophilic anion to be 0.05 mol or higher in the above-described range, the heat resistance of the obtained cured film can be further improved. In a case where the content of the salt of the low nucleophilic anion is 5 mol or lower in the above-described range, the heat resistance of the obtained cured film can be further improved without a decrease in the concentration of the near infrared absorbing compound A in the curable composition. In addition, elution of the salt of the low nucleophilic anion in the cured film surface can be suppressed, the surface shape of the cured film can be improved. Further, in a case where the cured film is applied to a liquid crystal display device or the like, elution or the like of the salt of the low nucleophilic anion in liquid crystals can be suppressed, and a high voltage retention rate can be maintained.

The salt of the low nucleophilic anion in the curable composition according to the present invention is preferably 0.05 to 20 parts by mass with respect to 100 parts by mass of the total solid content of the curable composition. The upper limit is preferably 15 parts by mass or less and more preferably 10 parts by mass or less. The lower limit is preferably 0.05 parts by mass or more.

As the salt of the low nucleophilic anion, one kind may be used alone, and two or more kinds may be used. In a case where the curable composition according to the present invention includes two or more salts of the low nucleophilic anion, the total content of the two or more salts of the low nucleophilic anion is preferably in the above-described range.

<<Other Near Infrared Absorbing Compounds>>

The curable composition according to the present invention may further include near infrared absorbing compounds (hereinafter, also referred to as "other near infrared absorbing compounds") other than the near infrared absorbing compound A.

Examples of the other near infrared absorbing compounds include a copper compound, a pyrrolopyrrole compound, a squarylium compound, a phthalocyanine compound, a naphthalocyanine compound, arylene compound, a merocyanine compound, a croconium compound, an oxonol compound, a dithiol compound, a triarylmethane compound, a pyrromethene compound, an azomethine compound, an anthraquinone compound, and a dibenzofuranone compound. Examples of the pyrrolopyrrole compound include a compound described in paragraphs "0049" to "0058" of JP2009-263614A, the content of which is incorporated herein by reference. Examples of the copper compound include copper compounds described in paragraphs "0013" to "0056" of JP2014-41318A and paragraphs "0012" to "0030" of JP2014-32380A, the content of which is incorporated herein by reference.

In addition, as the other near infrared absorbing compound, inorganic particles can also be used. As the inorganic particles, metal oxide particles or metal particles are preferable from the viewpoint of further improving infrared shielding properties. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles. Examples of the metal particles include silver (Ag) particles, gold (Au) particles, copper (Cu) particles, and nickel (Ni) particles. The shape of the inorganic particles is not particularly limited and may have a sheet shape, a wire shape, or a tube shape irrespective of whether or not the shape is spherical or non-spherical.

In addition, as the inorganic particles, a tungsten oxide compound can be used. Specifically, a tungsten oxide compound represented by Formula (compositional formula) (W-1) is more preferable.

$$M_xW_yO_z \quad (W-1)$$

M represents metal, W represents tungsten, and O represents oxygen.

$0.001 \leq x/y \leq 1.1$ $2.2 \leq z/y \leq 3.0$

Examples of the metal represented by M include an alkali metal, an alkali earth metal, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, and Bi. Among these, an alkali metal is preferable, Rb or Cs is more preferable, and Cs is still more preferable. As the metal represented by M, one kind or two or more kinds may be used.

By adjusting x/y to be 0.001 or higher, infrared light can be sufficiently shielded. By adjusting x/y to be 1.1 or lower, formation of an impurity phase in the tungsten oxide compound can be suppressed.

By adjusting z/y to be 2.2 or higher, chemical stability as a material can be further improved. By adjusting z/y to be 3.0 or lower, infrared light can be sufficiently shielded.

Specific examples of the tungsten oxide compound include $Cs_{0.33}WO_3$, $Rb_{0.33}WO_3$, $K_{0.33}WO_3$, and $Ba_{0.33}WO_3$. Among these, $Cs_{0.33}WO_3$ or $Rb_{0.33}WO_3$ is preferable, and $Cs_{0.33}WO_3$ is more preferable.

The tungsten oxide compound is available in the form of, for example, a dispersion of tungsten particles such as YMF-02 (manufactured by Sumitomo Metal Mining Co., Ltd.).

The average particle size of the inorganic particles is preferably 800 nm or less, more preferably 400 nm or less, and still more preferably 200 nm or less. By adjusting the average particle size of the inorganic particles to be in the above-described range, transparency in a visible range can be improved. From the viewpoint of avoiding light scattering, the less the average particle size, the better. However, due to the reason of handleability during manufacturing or the like, the average particle size of the inorganic particle is typically 1 nm or more.

The content of the other near infrared absorbing compounds is preferably 0.01 to 50 mass % with respect to the total solid content of the curable composition according to the present invention. The lower limit is preferably 0.1 mass % or higher and more preferably 0.5 mass % or higher. The upper limit is preferably 30 mass % or lower, and more preferably 15 mass % or lower.

<<Chromatic Colorant>>

The curable composition according to the present invention may include a chromatic colorant. In the present invention, "chromatic colorant" denotes a colorant other than a white colorant and a black colorant. It is preferable that the chromatic colorant is a colorant having an absorption in a wavelength range of 400 nm or longer and shorter than 650 nm.

In the present invention, the chromatic colorant may be a pigment or a dye. It is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment. In addition, regarding a particle size distribution of the secondary particles of the pigment (hereinafter, simply referred to as "particle size distribution") which can be used, it is preferable that secondary particles having a particle size of (average particle size±100) nm account for 70 mass % or higher, preferably, 80 mass % or higher in the pigment. The particle size distribution of the secondary particles can be measured using a scattering intensity distribution. The average particle size of primary particles can be obtained by observing a pigment with a scanning electron microscope (SEM) or a transmission electron microscope (TEM), measuring particle sizes of 100 particles in a region where particles do not aggregate, and obtaining an average value of the measured particle sizes.

The pigment is preferably an organic pigment, and examples thereof are as follows. However, the present invention is not limited to the examples:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triphenylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-34966A can also be used.

In a case where the curable composition according to the present invention includes a chromatic colorant, it is preferable that the content of the chromatic colorant is 0.1 to 70 mass % with respect to the total solid content of the curable composition according to the present invention. The lower limit is preferably 0.5 mass % or higher and more preferably 1.0 mass % or higher. The upper limit is preferably 60 mass % or lower, and more preferably 50 mass % or lower.

The content of the chromatic colorant is preferably 10 to 1000 parts by mass and more preferably 50 to 800 parts by mass with respect to 100 parts by mass of the total content of the near infrared absorbing compound A and the other near infrared absorbing compounds.

In addition, the total content of the total content of the chromatic colorant, the near infrared absorbing compound A, and the other near infrared absorbing compounds is preferably 1 to 80 mass % with respect to the total solid content of the curable composition according to the present invention. The lower limit is preferably 5 mass % or higher and more preferably 10 mass % or higher. The upper limit is preferably 70 mass % or lower, and more preferably 60 mass % or lower.

In a case where the curable composition according to the present invention includes two or more chromatic colorants, it is preferable that the total content of the two or more chromatic colorants is in the above-described range.

<<Coloring Material that Allows Transmission of at Least Part of Light in Near Infrared Range and Shields Light in Visible Range (Coloring Material that Shields Visible Light)>>

The curable composition according to the present invention may include a coloring material that shields visible light. The content of a pigment in the coloring material that shields visible light is preferably 90 mass % or higher, more preferably 95 mass % or higher, and still more preferably 99 mass % or higher with respect to the total mass of coloring material that shields visible light. In addition, it is preferable that black, gray, or a color similar to black or gray is exhibited using a combination of a plurality of coloring materials that shields visible light. In addition, it is preferable that the coloring material that shields visible light is a material that absorbs light in a wavelength range of violet to red. In addition, it is preferable that the coloring material that shields visible light is a coloring material that shields light in a wavelength range of 450 to 650 nm.

It is preferable that the coloring material that shields visible light satisfies at least one of the following requirement (1) or (2), and it is more preferable that the coloring material that shields visible light satisfies the requirement (1).

(1): An aspect in which the coloring material that shields visible light includes two or more chromatic colorants (2): An aspect in which the coloring material that shields visible light includes an organic black colorant In addition, in this specification, the organic black colorant as the coloring material that shields visible light denotes a material that absorbs light in a visible range and allows transmission of at least a part of light in a near infrared range. Accordingly, the organic black colorant as the coloring material that shields visible light does not denote a black colorant that absorbs both light in a near infrared range and light in a visible range, for example, carbon black or titanium black.

Examples of the chromatic colorant are as described above. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include compounds described in JP2010-534726A, JP2012-515233A, and JP2012-515234A. For example, "Irgaphor Black" (manufactured by BASF SE) is available. Examples of the perylene compound include C.I. Pigment Black 31 and 32. Examples of the azomethine compound include compounds described in JP1989-170601A (JP-H1-170601A) and JP1990-34664A (JP-H2-34664A). For example, "CHROMOFINE BLACK A1103" (manufactured by Dainichiseika Color & Chemicals Mfg. Co., Ltd.) is available.

It is preferable that the coloring material that shields visible light is a material in which a ratio A/B of a minimum value A of an absorbance in a wavelength range of 450 to 650 nm to a minimum value B of an absorbance in a wavelength range of 900 to 1300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants.

In a case where the coloring material that shields visible light includes two or more chromatic colorants, it is preferable that the chromatic colorants are selected from the group consisting of a red colorant, a green colorant, a blue colorant, a yellow colorant, a violet colorant, and an orange colorant.

In a case where the coloring material that shields visible light is formed using a combination of two or more chromatic colorants, examples of the combination of chromatic colorants are as follows.

(1) An aspect in which the coloring material that shields visible light includes a yellow colorant, a blue colorant, a violet colorant, and a red colorant (2) An aspect in which the coloring material that shields visible light includes a yellow colorant, a blue colorant, and a red colorant (3) An aspect in which the coloring material that shields visible light includes a yellow colorant, a violet colorant, and a red colorant (4) An aspect in which the coloring material that shields visible light includes a yellow colorant and a violet colorant (5) An aspect in which the coloring material that shields visible light includes a green colorant, a blue colorant, a violet colorant, and a red colorant (6) An aspect in which the coloring material that shields visible light includes a violet colorant and an orange colorant (7) An aspect in which the coloring material that shields visible light includes a green colorant, a violet colorant, and a red colorant (8) An aspect in which the coloring material that shields visible light includes a green colorant and a red colorant For example, ratios (mass ratios) between the respective colorants are as follows.

TABLE 11

| No. | Yellow Colorant | Green Colorant | Blue Colorant | Violet Colorant | Red Colorant | Orange Colorant |
|---|---|---|---|---|---|---|
| 1 | 0.1 to 0.4 | | 0.1 to 0.6 | 0.01 to 0.3 | 0.1 to 0.6 | |
| 2 | 0.1 to 0.4 | | 0.1 to 0.6 | | 0.2 to 0.7 | |
| 3 | 0.1 to 0.6 | | | 0.1 to 0.6 | 0.1 to 0.6 | |
| 4 | 0.2 to 0.8 | | | 0.2 to 0.8 | | |
| 5 | | 0.1 to 0.4 | 0.1 to 0.4 | 0.1 to 0.4 | 0.1 to 0.4 | |
| 6 | | | | 0.2 to 0.6 | | 0.4 to 0.8 |
| 7 | | 0.1 to 0.5 | | 0.2 to 0.7 | 0.1 to 0.4 | |
| 8 | | 0.5 to 0.8 | | | 0.2 to 0.5 | |

In a case where the curable composition according to the present invention includes the coloring material that shields visible light, the content of the coloring material that shields visible light is preferably 30 mass % or lower, more preferably 20 mass % or lower, and still more preferably 15 mass % or lower with respect to the total solid content of the curable composition. The lower limit is, for example, 0.01 mass % or higher or 0.5 mass % or higher.

In addition, the curable composition according to the present invention may not substantially include the coloring material that shields visible light. The curable composition substantially not including the coloring material that shields visible light represents that the content of the coloring material that shields visible light is preferably 0.005 mass % or lower, more preferably 0.001 mass % or lower, and still more preferably 0% with respect to the total solid content of the composition according to the present invention.

<<Curable Compound>>

The curable composition according to the present invention includes a curable compound. As the curable compound, a well-known compound which is curable by a radical, an acid, or heat can be used. Examples of the curable compound include a compound which has a group having an ethylenically unsaturated bond, a compound having an epoxy group, a compound having a methylol group, and a compound having an alkoxysilyl group. Examples of the group having an ethylenically unsaturated bond include a vinyl group, a (meth)allyl group, a (meth)acryloyl group, and a (meth)acryloyloxy group. Examples of the alkoxysilyl group include a monoalkoxysilyl group, a dialkoxysilyl group, and a trialkoxysilyl group. As the group having an ethylenically unsaturated bond, a (meth)acryloyl group or a (meth)acryloyloxy group is preferable. As the alkoxysilyl group, a dialkoxysilyl group or a trialkoxysilyl group is preferable. In addition, the number of carbon atoms in the alkoxy group of the alkoxysilyl group is preferably 1 to 5, more preferably 1 to 3, and still more preferably 1 or 2. It is preferable that the curable compound is a radically polymerizable compound such as a compound which has a group having an ethylenically unsaturated bond.

The curable compound may be in the form of a monomer or a polymer and is preferably a monomer. The molecular weight of the monomer type curable compound is preferably 100 to 3000. The upper limit is preferably 2000 or lower and more preferably 1500 or lower. The lower limit is preferably 150 or higher and more preferably 250 or higher. In addition, it is preferable that the curable compound is a compound substantially not having a molecular weight distribution. Here, the compound substantially not having a molecular weight distribution represents that the dispersity (weight-average molecular weight (Mw)/number-average molecular weight (Mn)) of the compound is preferably 1.0 to 1.5 and more preferably 1.0 to 1.3.

(Compound which has Group Having Ethylenically Unsaturated Bond)

In the present invention, as the curable compound, a compound which has a group having an ethylenically unsaturated bond can be used. It is preferable that the compound which has a group having an ethylenically unsaturated bond is a monomer. The molecular weight of the compound which has a group having an ethylenically unsaturated bond is preferably 100 to 3000. The upper limit is preferably 2000 or lower and more preferably 1500 or lower. The lower limit is preferably 150 or higher and more preferably 250 or higher. The compound which has a group having an ethylenically unsaturated bond is preferably a (meth)acrylate compound having 3 to 15 functional groups and more preferably a (meth)acrylate compound having 3 to 6 functional groups.

Examples of the compound can be found in paragraphs "0033" and "0034" of JP2013-253224A, the content of which is incorporated herein by reference. As the compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol or a propylene glycol residue is preferable. In addition, oligomers of the above-described examples can be used. In addition, the compound having an ethylenically unsaturated bond can be found in the description of a polymerizable compound in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US Patent App. No. 2012/0235099A), the content of which is incorporated herein by reference.

In addition, diglycerin ethylene oxide (EO)-modified (meth)acrylate (as a commercially available product, ARONIX M-460 manufactured by Toagosei Co., Ltd.) is preferable. Pentaerythritol tetraacrylate (A-TMMT manufactured by Shin-Nakamura Chemical Co., Ltd.) or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The compound which has a group having an ethylenically unsaturated bond may have an acid group such as a carboxyl group, a sulfo group, or a phosphate group. Examples of the compound having an acid group include an ester of an aliphatic polyhydroxy compound and an unsaturated carboxylic acid. A compound having an acid group obtained by causing a nonaromatic carboxylic anhydride to react with an unreacted hydroxyl group of an aliphatic polyhydroxy compound is preferable. In particular, it is more preferable that, in this ester, the aliphatic polyhydroxy compound is pentaerythritol and/or dipentaerythritol. Examples of a commercially available product of the monomer having an acid group include M-305, M-510, and M-520 of ARONIX series as polybasic acid-modified acrylic oligomer (manufactured by Toagosei Co., Ltd.). The acid value of the compound having an acid group is preferably 0.1 to 40 mgKOH/g. The lower limit is preferably 5 mgKOH/g or higher. The upper limit is preferably 30 mgKOH/g or lower.

In addition, a compound having a caprolactone structure is also preferable as the compound which has a group having an ethylenically unsaturated bond. The compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the compound having a caprolactone structure can be found in paragraphs "0042" to "0045" of JP2013-253224A, the content of which is incorporated herein by reference. Examples of the compound having a caprolactone structure include: DPCA-20, DPCA-30, DPCA-60, and DPCA-120 which are commercially available as KAYARADDPCA series manufactured by Nippon Kayaku Co., Ltd.; SR-494 (manufactured by Sartomer) which is a tetrafunctional acrylate having four ethyleneoxy chains; and TPA-330 which is a trifunctional acrylate having three isobutyleneoxy chains.

As the compound which has a group having an ethylenically unsaturated bond, a urethane acrylate described in JP1973-41708B (JP-S48-41708B), JP1976-37193A (JP-S51-37193A), JP1990-32293B (JP-H2-32293B), or JP1990-16765B (JP-H2-16765B), or a urethane compound having a ethylene oxide skeleton described in JP1983-49860B (JP-S58-49860B), JP1981-17654B (JP-S56-17654B), JP1987-39417B (JP-S62-39417B), or JP1987-39418B (JP-S62-39418B) is also preferable. In addition, the compound which has a group having an ethylenically unsaturated bond can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A). Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

(Compound Having Epoxy Group)

In the present invention, as the curable compound, a compound having an epoxy group can also be used.

Examples of the compound having an epoxy group include a compound having one or more epoxy groups in one molecule. In particular, a compound having two or more epoxy groups in one molecule is preferable. The number of epoxy groups in one molecule is preferably 1 to 100. The upper limit is, for example, 10 or less or 5 or less. The lower limit is preferably 2 or more.

In the compound having an epoxy group, an epoxy equivalent (=the molecular weight of the compound having an epoxy group/the number of epoxy groups) is preferably 500 g/eq or lower, more preferably 100 to 400 g/eq, and still more preferably 100 to 300 g/eq.

The compound having an epoxy group may be a low molecular weight compound (for example, molecular weight: lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 10000 or lower, more preferably 5000 or lower, and still more preferably 3000 or lower.

Examples of the compound having an epoxy group include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group and another silicon compound, and a copolymer of a polymerizable unsaturated compound having an epoxy group and another polymerizable unsaturated compound.

Examples of the epoxy resin which is a glycidyl-etherified product of a phenol compound include: 2-[4-(2,3-epoxypropoxy)phenyl]-2-[4-[1,1-bis[4-(2,3-hydroxy)phenyl] ethyl]phenyl]propane, bisphenol A, bisphenol F, bisphenol S, 4,4'-biphenol, tetramethyl bisphenol A, dimethyl bisphenol A, tetramethyl bisphenol F, dimethyl bisphenol F, tetramethyl bisphenol S, dimethyl bisphenol S, tetramethyl-4,4'-biphenol, dimethyl-4,4'-biphenol, 1-(4-hydroxyphenyl)-2-[4-(1,1-bis-(4-hydroxyphenyl)ethyl)phenyl]propane, 2,2'-methylene-bis(4-methyl-6-t-butylphenol), 4,4'-butylidene-bis(3-methyl-6-t-butylphenol), trishydroxyphenylmethane, resorcinol, hydroquinone, pyrogallol, fluoroglycinol, a phenol having a diisopropylidene skeleton; a phenol having a fluorene skeleton such as 1,1-di-4-hydroxyphenyl fluorene; and an epoxy resin which is a glycidyl-etherified product of a polyphenol compound, such as phenolic polybutadiene.

Examples of the epoxy resin which is a glycidyl-etherified product of a novolac resin include glycidyl-etherified products of various novolac resins including: novolac resins which contain various phenols, for example, phenol, cresols, ethyl phenols, butyl phenols, octyl phenols, bisphenols such as bisphenol A, bisphenol F, or bisphenol S, or naphthols; phenol novolac resins having a xylylene skeleton; phenol novolac resins having a xylylene skeleton; phenol novolac resins having a biphenyl skeleton; or phenol novolac resins having a fluorene skeleton.

Examples of the alicyclic epoxy resin include an alicyclic epoxy resin having an aliphatic ring skeleton such as 3,4-epoxycyclohexylmethyl-(3,4-epoxy)cyclohexylcarboxylate or bis(3,4-epoxycyclohexylmethyl)adipate.

Examples of the aliphatic epoxy resin include glycidyl ethers of polyhydric alcohols such as 1,4-butanediol, 1,6-hexanediol, polyethylene glycol, or pentaerythritol.

Examples of the heterocyclic epoxy resin include an heterocyclic epoxy resin having a heterocycle such as an isocyanuric ring or a hydantoin ring.

Examples of the glycidyl ester epoxy resin include an epoxy resin including a carboxylic acid ester such as hexahydrophthalic acid diglycidyl ester.

Examples of the glycidyl amine epoxy resin include an epoxy resin which is a glycidylated product of an amine such as aniline or toluidine.

Examples of the epoxy resin which is a glycidylated product of a halogenated phenol include an epoxy resin which is a glycidylated product of a halogenated phenol such as brominated bisphenol A, brominated bisphenol F, brominated bisphenol S, brominated phenol novolac, brominated cresol novolac, chlorinated bisphenol S, or chlorinated bisphenol A.

Examples of a commercially available product of the copolymer of a polymerizable unsaturated compound having an epoxy group and another polymerizable unsaturated compound include MARPROOF G-0150M, G-0105SA, G-0130SP, G-0250SP, G-1005S, G-1005SA, G-1010S, G-2050M, G-01100, and G-01758. Examples of the polymerizable unsaturated compound having an epoxy group include glycidyl acrylate, glycidyl methacrylate, and 4-vinyl-1-cyclohexene-1,2-epoxide. In addition, examples of a copolymer of the other polymerizable unsaturated compound include methyl (meth)acrylate, benzyl (meth)acrylate, cyclohexyl (meth)acrylate, styrene, and vinyl cyclohexane. Among these, methyl (meth)acrylate, benzyl (meth)acrylate, or styrene is preferable.

As the compound having an epoxy group, compounds described in paragraphs "0034" to "0036" of JP2013-011869A, paragraphs "0147" to "0156" of JP2014-043556A, and paragraphs "0085" to "0092" of JP2014-089408A can also be used. The contents of which are incorporated herein by reference. Regarding the commercially available product, examples of the bisphenol A epoxy resin include jER825, jER827, jER828, jER834, jER1001, jER1002, jER1003, jER1055, jER1007, jER1009, and jER1010 (all of which are manufactured by Mitsubishi Chemical Corporation) and EPICLON860, EPICLON1050, EPICLON1051, and EPICLON1055 (all of which are manufactured by DIC Corporation). Examples of the bisphenol F epoxy resin include jER806, jER807, jER4004, jER4005, jER4007, and jER4010 (all of which are manufactured by Mitsubishi Chemical Corporation), EPICLON830 and EPICLON835 (all of which are manufactured by DIC Corporation), and LCE-21 and RE-602S (all of which are manufactured by Nippon Kayaku Co., Ltd.). Examples of the phenol novolac epoxy resin include jER152, jER154, jER157S70, and jER157S65 (all of which are manufactured by Mitsubishi Chemical Corporation) and EPICLON N-740, EPICLON N-770, and EPICLON N-775 (all of which are manufactured by DIC Corporation). Examples of the cresol novolac epoxy resin include EPICLON N-660, EPICLON N-665, EPICLON N-670, EPICLON N-673, EPICLON N-680, EPICLON N-690, and EPICLON N-695 (all of which are manufactured by DIC Corporation) and EOCN-1020 (manufactured by Nippon Kayaku Co., Ltd.). Examples of the aliphatic epoxy resin include ADEKA RESIN EP-4080S, ADEKA RESIN EP-4085S, and ADEKA RESIN EP-4088S (all of which are manufactured by Adeka Corporation), CELLOXIDE 2021P, CELLOXIDE 2081, CELLOXIDE 2083, CELLOXIDE 2085, EHPE3150, EPO-LEAD PB 3600, and EPOLEAD PB 4700 (all of which are manufactured by Daicel Corporation), and DENACOL EX-212L, DENACOL EX-214L, DENACOL EX-216L, DENACOL EX-321L, and DENACOL EX-850L (all of which are manufactured by Nagase ChemteX Corporation). Other examples of the commercially available product include ADEKA RESIN EP-4000S, ADEKA RESIN EP-4003S, ADEKA RESIN EP-4010S, and ADEKA RESIN EP-4011S (all of which are manufactured by Adeka Corporation), NC-2000, NC-3000, NC-7300, XD-1000, EPPN-501, and EPPN-502 (all of which are manufactured by Adeka Corporation), jER1031S (manufactured by Mitsubishi Chemical Corporation), and OXT-221 (manufactured by Toagosei Co., Ltd.).

As the compound having an epoxy group, for example, a compound described in paragraph "0045" of JP2009-265518A can also be used.

(Compound Having Alkoxysilyl Group)

In the present invention, as the curable compound, a compound having an alkoxysilyl group can also be used. The number of carbon atoms in the alkoxy group of the alkoxysilyl group is preferably 1 to 5, more preferably 1 to 3, and still more preferably 1 or 2. It is preferable that two or more alkoxysilyl groups are present in one molecule, and it is more preferable that two or three alkoxysilyl groups are present in one molecule. Specific examples of the compound having an alkoxysilyl group include methyl trimethoxysilane, dimethyl dimethoxysilane, phenyl trimethoxysilane, methyltriethoxysilane, and dimethyl diethoxysilane, phenyltriethoxysilane, n-propyltrimethoxysilane, n-propyltriethoxysilane, hexyl trimethoxysilane, hexyl triethoxysilane, octyl triethoxysilane, decyl trimethoxysilane, 1,6-bis(trimethoxysilyl)hexane, trifluoropropyltrimethoxysilane, hexamethyldisilazane, vinyl trimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, tris-(trimethoxysilylpropyl)isocyanurate, 3-ureidopropyltriethoxysilane, 3-mercaptopropylmethyldimethoxysilane, 3-mercaptopropyltrimethoxysilane, and bis(triethoxysilylpropyl)tetrasulfide, and 3-isocyanatepropyltriethoxysilane. In addition to the above-described examples, an alkoxy oligomer can be used. In addition, the following compounds can also be used.

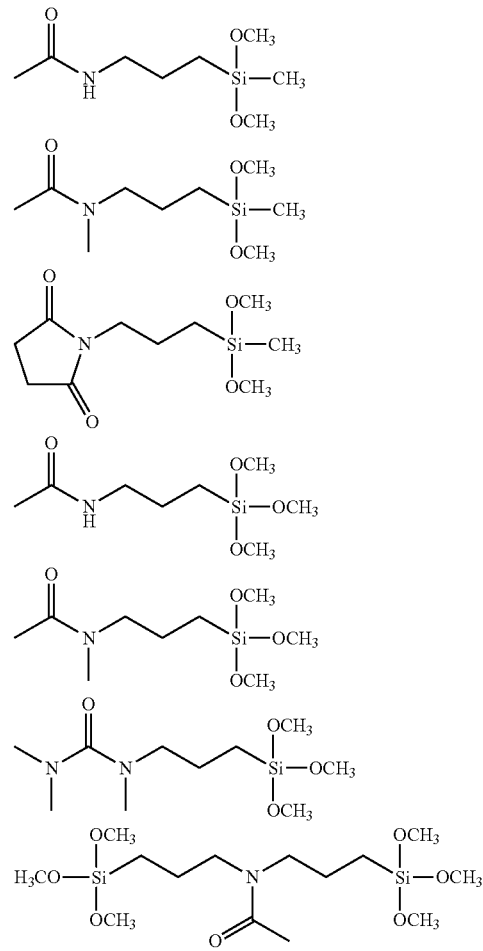

Examples of a commercially available product of the silane coupling agent include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, X-40-9225, X-40-9246, X-40-9250, KR-401N, X-40-9227, X-40-9247, KR-510, KR-9218, KR-213, X-40-2308, and X-40-9238 (all of which are manufactured by Shin-Etsu Chemical Co., Ltd.).

In addition, as the compound having an alkoxysilyl group, a polymer having an alkoxysilyl group at a side chain can also be used.

(Compound Having Methylol Group)

In the present invention, as the curable compound, a compound having a methylol group can also be used. Examples of the compound having a methylol group include a compound in which a methylol group is bonded to a nitrogen atom or a carbon atom which forms an aromatic ring.

As the compound in which a methylol group is bonded to a nitrogen atom, for example, alkoxy methylated melamine, methylolated melamine, alkoxy methylated benzoguanamine, methylolated benzoguanamine, alkoxy methylated glycoluril, methylolated glycoluril, alkoxy methylated urea, or methylolated urea is preferable. In addition, 1,3,4,6-tetramethoxydimethyl glycoluril is also preferable. In addition, the details can be found in paragraphs "0134" to "0147" of JP2004-295116A or paragraphs "0095" to "0126" of JP2014-089408A, the content of which is incorporated herein by reference.

Preferable examples of a commercially available product of the compound having a methylol group include: CYMEL 300, 301, 303, 370, 325, 327, 701, 266, 267, 238, 1141, 272, 202, 1156, 1158, 1123, 1170, 1174, UFR65, and 300 (all of which are manufactured by Mitsubishi Cyanamid); and NIKALAC MX-750, -032, -706, -708, -40, -31, -270, -280, -290, -750LM, NIKALAC MS-11, NIKALAC MW-30HM, -100LM, and -390 (all of which are manufactured by Sanwa Chemical Co., Ltd.).

The content of the curable compound is preferably 0.1 to 40 mass % with respect to the total solid content of the curable composition. For example, the lower limit is preferably 0.5 mass % or higher and more preferably 1 mass % or higher. For example, the upper limit is more preferably 30 mass % or lower and still more preferably 20 mass % or lower. As the curable compound, one kind may be used alone, or two or more kinds may be used in combination. In a case where two or more compounds having an epoxy group are used in combination, it is preferable that the total content of the compounds having an epoxy group is in the above-described range.

<<Resin>>

The curable composition according to the present invention may include a resin. The resin is mixed, for example, in order to disperse particles of the pigments and the like in the composition or to be added as a binder. The resin which is mainly used to disperse particles of the pigments and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher. In addition, in a case where the resin is an epoxy resin, the weight-average molecular weight (Mw) of the epoxy resin is preferably 100 or higher and more preferably 200 to 2000000. The upper limit is preferably 1000000 or lower and more preferably 500000 or lower. The lower limit is preferably 100 or higher and more preferably 200 or higher.

Examples of the resin include a (meth)acrylic resin, an epoxy resin, an enethiol resin, a polycarbonate resin, a polyether resin, a polyarylate resin, a polysulfone resin, a polyethersulfone resin, a polyparaphenylene resin, a polyarylene ether phosphine oxide resin, a polyimide resin, a polyamide imide resin, a polyolefin resin, a cyclic olefin resin, a polyester resin, and a styrene resin. Among these resins, one kind may be used alone, or a mixture of two or more kinds may be used.

Examples of the (meth)acrylic resin include a polymer including a structural unit derived from (meth)acrylic acid and/or an ester thereof. Specific examples of the (meth)acrylic resin include a polymer obtained by polymerization of at least one selected from the group consisting of (meth)acrylic acid, a (meth)acrylic acid ester, a (meth)acrylamide, and a (meth)acrylonitrile.

Examples of the polyester resin include: a polymer obtained by a reaction of a polyol (for example, ethylene glycol, propylene glycol, glycerin, or trimethylolpropane) and a polybasic acid (for example, an aromatic dicarboxylic acid such as terephthalic acid, isophthalic acid, or naphthalenedicarboxylic acid, an aromatic dicarboxylic acid in which an aromatic hydrogen atom of the above-described aromatic dicarboxylic acid is substituted with a methyl group, an ethyl group, a phenyl group, or the like, an aliphatic dicarboxylic acid having 2 to 20 carbon atoms such as adipic acid, sebacic acid, or dodecanedicarboxylic acid, or an alicyclic dicarboxylic acid such as cyclohexanedicarboxylic acid); and a polymer (for example, polycaprolactone) obtained by ring-opening polymerization of a cyclic ester compound such as a caprolactone monomer.

Examples of the styrene resin include polyhydroxystyrene.

In addition, the resin may have an acid group. Examples of the acid group include a carboxyl group, a phosphate group, a sulfonate group, and a phenolic hydroxyl group. Among these acid groups, one kind may be used alone, or two or more kinds may be used in combination. The resin having an acid group can also be used as an alkali-soluble resin. In addition, the resin having an acid group can also be used as the dispersant.

As the resin having an acid group, a polymer having a carboxyl group at a side chain thereof is preferable, and examples thereof include: an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac type resin; an acidic cellulose derivative having a carboxyl group at a side chain thereof; and a resin obtained by adding an acid anhydride to a polymer having a hydroxyl group. In particular, a copolymer of (meth)acrylic acid and another monomer which is copolymerizable with the (meth)acrylic acid is preferable. Examples of the other monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth) acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. As other monomers, a N-position-substituted maleimide monomer described in JP1998-300922A (H10-300922A) (for example, N-phenylmaleimide or N-cyclohexylmaleimide) can also be used. As the other monomer which is copolymerizable with the (meth)acrylic acid, one kind may be used alone, or two or more kinds may be used in combination.

As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth) acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer obtained by polymerization of monomer components including at least one selected from the group consisting of a compound represented by the following Formula (ED1) and a compound represented by the following Formula (ED2) (hereinafter, these compounds will also be referred to as "ether dimer") is also preferable.

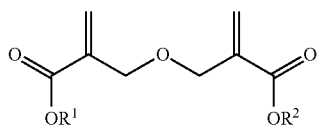

(ED1)

In Formula (ED1), $R^1$ and $R^2$ each independently represent a hydrogen atom or a hydrocarbon group having 1 to 25 carbon atoms which may have a substituent.

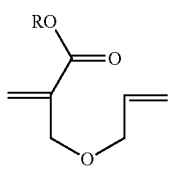

(ED2)

In Formula (ED2), R represents a hydrogen atom or an organic group having 1 to 30 carbon atoms. Specific examples of Formula (ED2) can be found in the description of JP2010-168539A.

The hydrocarbon group having 1 to 25 carbon atoms represented by $R^1$ and $R^2$ in Formula (ED1) which may have a substituent is not particularly limited, and examples thereof include a linear or branched alkyl group such as methyl, ethyl, n-propyl, isopropyl, n-butyl, isobutyl, tert-butyl, tert-amyl, stearyl, lauryl, or 2-ethylhexyl; an aryl group such as phenyl; an alicyclic group such as cyclohexyl, tert-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Specific examples of the ether dimer can be found in paragraph "0317" of JP2013-29760A, the content of which is incorporated herein by reference. Among these ether dimers, one kind may be used alone, or two or more kinds may be used in combination.

The resin having an acid group may include a structural unit which is derived from a compound represented by the following Formula (X).

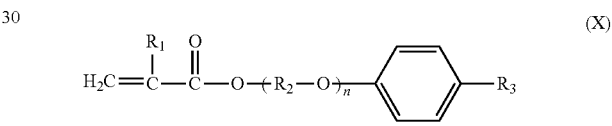

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

In Formula (X), the number of carbon atoms in the alkylene group of $R_2$ is preferably 2 to 3. In addition, the number of carbon atoms in the alkyl group of $R_3$ is preferably 1 to 20 and more preferably 1 to 10, and the alkyl group of $R_3$ may have a benzene ring. Examples of the alkyl group having a benzene ring represented by $R_3$ include a benzyl group and a 2-phenyl(iso)propyl group.

The details of the resin having an acid group can be found in paragraphs "0558" to "0571" of JP2012-208494A (corresponding to paragraphs "0685" to "0700" of US Patent App. No. 2012/0235099A) and paragraphs "0076" to "0099" of JP2012-198408A, the contents of which are incorporated herein by reference.

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

The resin may have a curable group. Examples of the curable group include a group having an ethylenically unsaturated bond, an epoxy group, a methylol group, and an alkoxysilyl group. Examples of the group having an ethylenically unsaturated bond include a vinyl group, a (meth) allyl group, a (meth)acryloyl group, and a (meth)acryloyloxy group. Examples of the alkoxysilyl group include a monoalkoxysilyl group, a dialkoxysilyl group, and a trialkoxysilyl group. Examples of the structural unit having a curable group include the following Formulae (A2-1) to (A2-4).

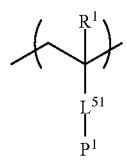
(A2-1)

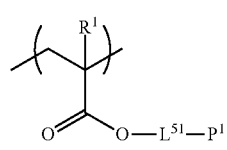
(A2-2)

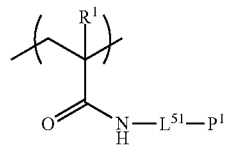
(A2-3)

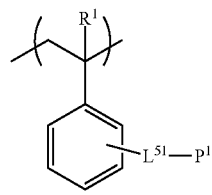
(A2-4)

$R^1$ represents a hydrogen atom or an alkyl group. The number of carbon atoms in the alkyl group is preferably 1 to 5, more preferably 1 to 3, and still more preferably 1. It is preferable that $R^1$ represents a hydrogen atom or a methyl group.

$L^{51}$ represents a single bond or a divalent linking group. Examples of the divalent linking group include an alkylene group, an arylene group, —O—, —S—, —CO—, —COO—, —OCO—, —SO$_2$—, —NR$^{10}$— (R$^{10}$ represents a hydrogen atom or an alkyl group and preferably a hydrogen atom), and a group including a combination thereof. Among these, a group including a combination —O— and at least one of an alkylene group, an arylene group, or an alkylene group is preferable. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10.

$P^1$ represents a curable group. Examples of the curable group include a group having an ethylenically unsaturated bond, an epoxy group, a methylol group, and an alkoxysilyl group. Examples of the group having an ethylenically unsaturated bond include a vinyl group, a (meth)allyl group, a (meth)acryloyl group, and a (meth)acryloyloxy group. Examples of the alkoxysilyl group include a monoalkoxysilyl group, a dialkoxysilyl group, and a trialkoxysilyl group.

Examples of the resin having a curable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), BISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.). In addition, for example, the following resins can also be used.

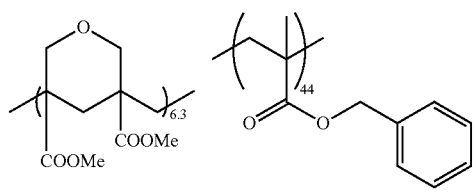

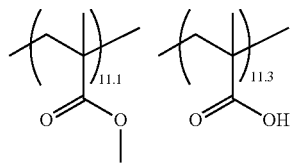

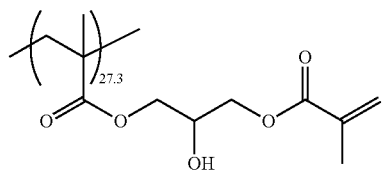

It is also preferable that the resin has a structural unit represented by any one of Formulae (A3-1) to (A3-7).

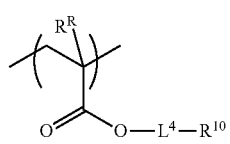
(A3-1)

(A3-2)

(A3-3)

(A3-4)

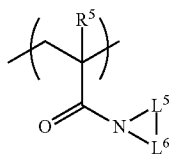
(A3-5)

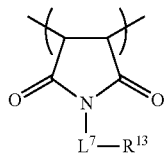
(A3-6)

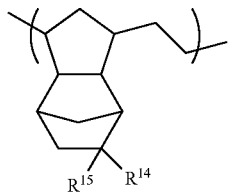
(A3-7)

In the formulae, $R^5$ represents a hydrogen atom or an alkyl group, $L^4$ to $L^7$ each independently represent a single bond or a divalent linking group, and $R^{10}$ to $R^{13}$ each independently represent an alkyl group or an aryl group. $R^{14}$ and $R^{15}$ each independently represent a hydrogen atom or a substituent.

$R^5$ has the same definition and the same preferable range as $R^1$ in Formulae (A2-1) to (A2-4).

$L^4$ to $L^7$ have the same definition and the same preferable range as $L^{51}$ in Formulae (A2-1) to (A2-4).

The alkyl group represented by $R^{10}$ may be linear, branched, or cyclic and is preferably cyclic. The alkyl group may have a substituent or may be unsubstituted. The number of carbon atoms in the alkyl group is preferably 1 to 30, more preferably 1 to 20, and still more preferably 1 to 10. The number of carbon atoms in the aryl group represented by $R^{10}$ is preferably 6 to 18, more preferably 6 to 12, and still more preferably 6. It is preferable that $R^{10}$ represents a cyclic alkyl group or an aryl group.

The alkyl group represented by $R^{11}$ and $R^{12}$ may be linear, branched, or cyclic and is preferably linear or branched. The alkyl group may have a substituent or may be unsubstituted. The number of carbon atoms in the alkyl group is preferably 1 to 12, more preferably 1 to 6, and still more preferably 1 to 4. The number of carbon atoms in the aryl group represented by $R^{11}$ and $R^{12}$ is preferably 6 to 18, more preferably 6 to 12, and still more preferably 6. It is preferable that $R^{11}$ and $R^{12}$ represent a linear or branched alkyl group.

The alkyl group represented by $R^{13}$ may be linear, branched, or cyclic and is preferably linear or branched. The alkyl group may have a substituent or may be unsubstituted. The number of carbon atoms in the alkyl group is preferably 1 to 12, more preferably 1 to 6, and still more preferably 1 to 4. The number of carbon atoms in the aryl group represented by $R^{13}$ is preferably 6 to 18, more preferably 6 to 12, and still more preferably 6. It is preferable that $R^{13}$ represents a linear or branched alkyl group or an aryl group.

Examples of the substituent represented by $R^{14}$ and $R^{15}$ include the substituents described above regarding the substituent T. In particular, it is preferable that at least one of $R^{14}$ or $R^{15}$ represents a cyano group or —COORa. Ra represents a hydrogen atom or a substituent. Examples of the substituent include the above-described substituents. For example, an alkyl group or an aryl group is preferable.

Examples of a commercially available product of the resin having a structural unit represented by Formula (A3-7) include ARTON F4520 (manufactured by JSR Corporation).

In the present invention, it is also preferable that MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer) is used as the resin.

In the curable composition according to the present invention, the content of the resin is preferably 1 to 80 mass % with respect to the total solid content of the curable composition according to the present invention. The lower limit is preferably 5 mass % or higher and more preferably 7 mass % or higher. The upper limit is preferably 50 mass % or lower and more preferably 30 mass % or lower.

<<Photopolymerization Initiator>>

The curable composition according to the present invention may include a photopolymerization initiator. In particular, in case where the curable composition according to the present invention includes a radically polymerizable component such as a resin which includes a group having an ethylenically unsaturated bond or a radically polymerizable compound, it is preferable that the composition includes a photopolymerization initiator. The photopolymerization initiator is not particularly limited and can be appropriately selected from well-known photopolymerization initiators. For example, a photopolymerization initiator having photosensitivity to light in a range from an ultraviolet range to a visible range is preferable. It is preferable that the photopolymerization initiator is a photoradical polymerization initiator. In addition, it is preferable that the photopolymerization initiator is at least one compound having a molar absorption coefficient of at least 50 in a range of about 300 nm to 800 nm (preferably 330 nm to 500 nm).

Examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-553-133428A), a compound described in Great German Patent No. 3337024, a compound described in J. Org. Chem.; 29, 1527 (1964) by F. C. Schaefer et al., a compound described in JP1987-58241A (JP-562-58241A), a compound described in JP1993-281728A (JP-H5-281728A), a compound described in JP1993-34920A (JP-55-34920A), and a compound described in U.S. Pat. No. 4,212,976A (for example, a compound having an oxadiazole skeleton).

In addition, from the viewpoint of exposure sensitivity, a compound selected from the group consisting of a trihalomethyltriazine compound, a benzyldimethylketanol compound, an α-hydroxy ketone compound, an α-amino ketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadienebenzene-iron complex and a salt thereof, and a halomethyl oxadiazole compound, a 3-aryl-substituted coumarin compound is preferable.

As the photopolymerization initiator, a hydroxyacetophenone compound, an aminoacetophenone compound, or an acylphosphine compound can also be preferably used. More specifically, for example, an aminoacetophenone initiator described in JP1998-291969A (JP-H10-291969A) or an acylphosphine initiator described in JP4225898B can also be used. As the hydroxyacetophenone initiator, for example, IRGACURE-184, DAROCUR-1173, IRGACURE-500, IRGACURE-2959, or IRGACURE-127 (trade name, all of which are manufactured by BASF SE) can be used. As the aminoacetophenone initiator, IRGACURE-907, IRGACURE-369, or IRGACURE-379EG (trade name, all of which are manufactured by BASF SE) which is a commercially available product can be used. As the aminoacetophenone initiator, a compound described in JP2009-191179A whose absorption wavelength is adjusted to match with that of a light source having a long wavelength of, for example, 365 nm or 405 nm can also be used.

As the acylphosphine initiator, IRGACURE-819, or DAROCUR-TPO (trade name, all of which are manufactured by BASF SE) which is a commercially available product can be used.

As the photopolymerization initiator, for example, an oxime compound is more preferable. Specific examples of the oxime compound include a compound described in JP2001-233842A, a compound described in JP2000-80068A, a compound described in JP2006-342166A, and a compound described in JP2016-21012A.

Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, or JP2000-66385A; and a compound described in JP2000-80068A, JP2004-534797A, or JP2006-342166A. As a commercially available product of the oxime compound, IRGACURE OXE01 (manufactured by BASF SE) and IRGACURE OXE02 (manufactured by BASF SE) can also be preferably used. In addition, TR-PBG-304 (manufactured by Changzhou Tronly New Electronic Materials Co., Ltd.), and ADEKA ARKLS NCI-930 (manufactured by Adeka Corporation) can also be used.

In addition, in addition to the above-described oxime compounds, for example, a compound described in JP2009-519904A in which oxime is linked to a N-position of carbazole, a compound described in U.S. Pat. No. 7,626,957B in which a hetero substituent is introduced into the benzophenone site, a compound described in JP2010-15025A or US Patent App. No. 2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an absorption at 405 nm and having excellent sensitivity to a light source of g-rays, or a compound described in paragraphs "0076" to "0079" of JP2014-137466A may be used.

Other preferable examples of the oxime compound can be found in paragraphs "0274" to "0275" of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

(OX-1)

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may have another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable. These groups may have one or more substituents. Examples of the substituent are as described above.

In Formula (OX-1), as the divalent organic group represented by A, an alkylene group having 1 to 12 carbon atoms, a cycloalkylene group, or an alkynylene group is preferable. These groups may have one or more substituents. Examples of the substituent are as described above.

In the present invention, an oxime compound having a fluorene ring can also be used as the photopolymerization initiator. Specific examples of the oxime compound having a fluorene ring include a compound described in JP2014-137466A. The content is incorporated herein by reference.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

In the present invention, as the photopolymerization initiator, an oxime compound having a nitro group can be used. It is preferable that the oxime compound having a nitro group is a dimer. Specific examples of the oxime compound having a nitro group include compounds described in paragraphs "0031" to "0047" of JP2013-114249A and paragraphs "0008" to "0012" and "0070" to "0079" of JP2014-137466A, compounds described in paragraphs "0007" to 0025" of JP4223071B, and ADEKA ARKLS NCI-831 (manufactured by Adeka Corporation).

Hereinafter, specific examples of the oxime compound which are preferably used in the present invention are shown below, but the present invention is not limited thereto.
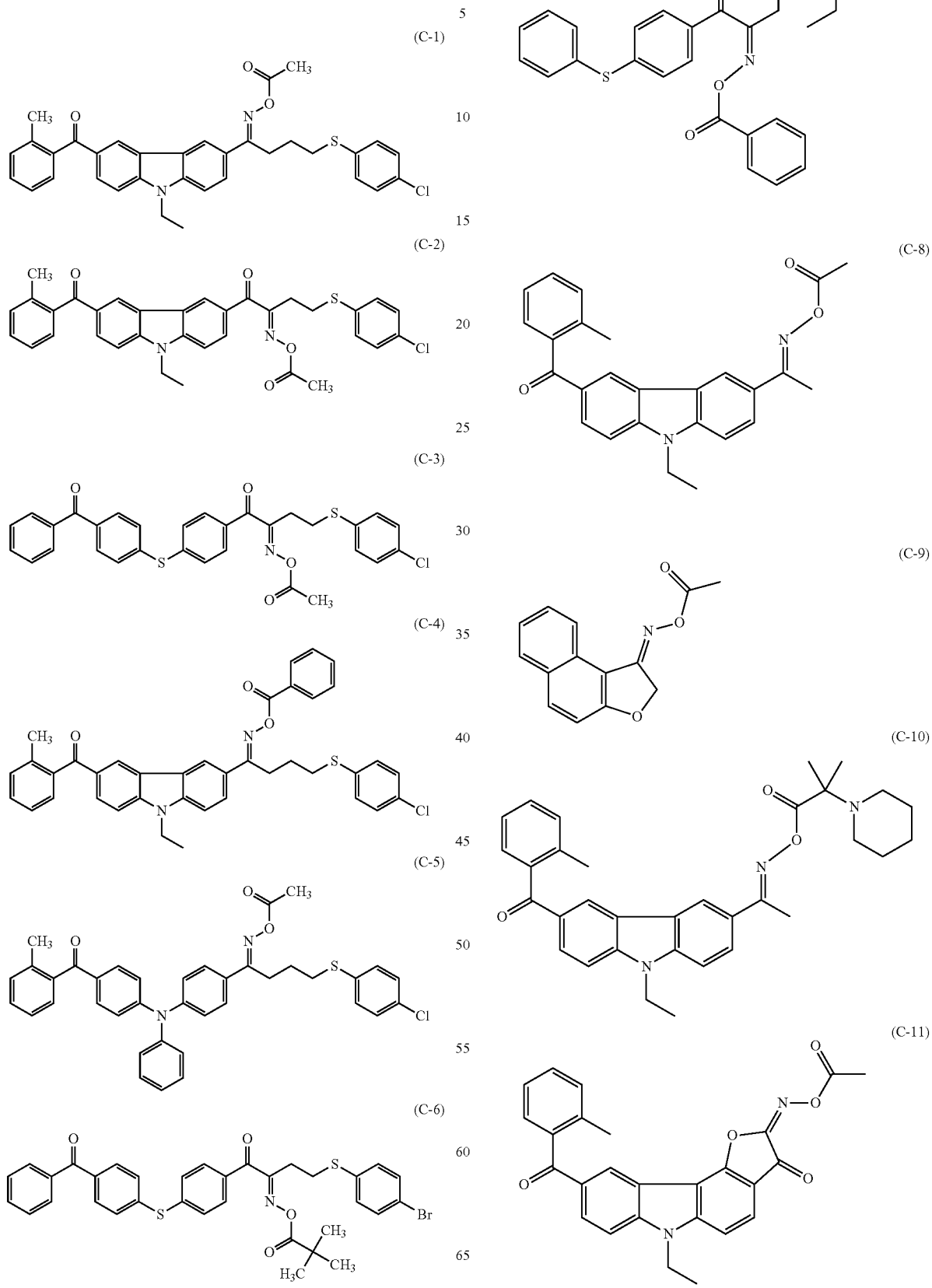

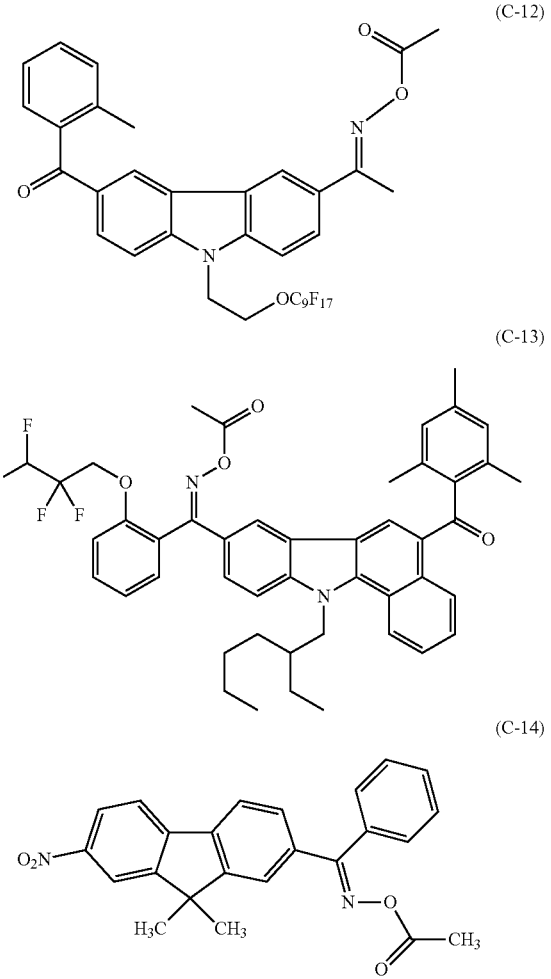

As the oxime compound, a compound having an absorption maximum in a wavelength range of 350 nm to 500 nm is preferable, a compound having an absorption wavelength in a wavelength range of 360 nm to 480 nm is more preferable, and a compound having a high absorbance at 365 nm and 405 nm is still more preferable.

The molar absorption coefficient of the oxime compound at 365 nm or 405 nm is preferably 1000 to 300000, more preferably 2000 to 300000, and still more preferably 5000 to 200000 from the viewpoint of sensitivity. The molar absorption coefficient of the compound can be measured using a well-known method. For example, the molar absorption coefficient of the compound can be measured using an ultraviolet-visible spectrophotometer (Cary-5 spectrophotometer, manufactured by Varian Medical Systems, Inc.) and an ethyl acetate solvent at a concentration of 0.01 g/L.

The content of the photopolymerization initiator is preferably 0.1 to 50 mass %, more preferably 0.5 to 30 mass %, and still more preferably 1 to 20 mass % with respect to the total solid content of the curable composition according to the present invention. In the above-described range, excellent sensitivity and pattern formability can be obtained. The curable composition according to the present invention may include one photopolymerization initiator or two or more photopolymerization initiators. In a case where the infrared absorbing composition includes two or more photopolymerization initiators, it is preferable that the total content of the two or more photopolymerization initiators is in the above-described range.

<<Catalyst>>

The curable composition according to the present invention may include a catalyst. In particular, in a case where the compound having an alkoxysilyl group is used as the curable compound, a sol-gel reaction is promoted and a strong cured film is obtained by addition of the catalyst. Examples of the catalyst include an acid catalyst and a base catalyst. Examples of the acid catalyst include hydrochloric acid, nitric acid, sulfuric acid, sulfurous acid, hydrogen sulfide, perchloric acid, hydrogen peroxide, carbonic acid, a carboxylic acid such as formic acid or acetic acid, a substituted carboxylic acid in which R in a structural formula represented by RCOOH is substituted with another element or a substituent, a sulfonic acid such as benzenesulfonic acid, and phosphoric acid. Further, Lewis acid such as aluminum chloride, aluminum acetylacetonate, zinc chloride, tin chloride, a boron trifluoride diethyl ether complex, or iodotrimethylsilane may be used. In addition, examples of the base catalyst include an ammonia base compound such as ammonia water and an organic amine such as ethylamine or aniline. In addition, as the catalyst, a catalyst described in paragraphs "0070" to "0076" of JP2013-201007A can also be used.

The content of the catalyst is preferably 0.1 to 100 parts by mass, more preferably 0.1 to 50 parts by mass, and still more preferably 0.1 to 20 parts by mass with respect to 100 parts by mass of the curable compound. The curable composition according to the present invention may include one catalyst or two or more catalysts. In a case where the infrared absorbing composition includes two or more catalysts, it is preferable that the total content of the two or more catalysts is in the above-described range.

<<Acid Anhydride, Polycarboxylic Acid>>

In a case where the curable composition according to the present invention includes a compound having an epoxy group, it is preferable that the curable composition further includes at least one selected from an acid anhydride and a polycarboxylic acid.

Specific examples of the acid anhydride include phthalic anhydride, trimellitic anhydride, pyromellitic anhydride, maleic anhydride, tetrahydrophthalic anhydride, methyltetrahydrophthalic anhydride, methylnadic anhydride, nadic anhydride, hexahydrophthalic anhydride, methylhexahydrophthalic anhydride, glutaric anhydride, 2,4-diethylglutaric anhydride, 3,3-dimethylglutaric anhydride, butanetetracarboxylic anhydride, bicyclo[2,2,1]heptane-2,3-dicarboxylic anhydride, methylbicyclo[2,2,1]heptane-2,3-dicarboxylic anhydride, and cyclohexane-1,3,4-tricarboxylic acid-3,4 anhydride. In particular, methyltetrahydrophthalic anhydride, methylnadic anhydride, nadic anhydride, hexahydrophthalic anhydride, methylhexahydrophthalic anhydride, 2,4-diethylglutaric anhydride, butanetetracarboxylic anhydride, bicyclo[2,2,1]heptane-2,3-dicarboxylic anhydride, or methylbicyclo[2,2,1]heptane-2,3-dicarboxylic anhydride, or cyclohexane-1,3,4-tricarboxylic acid-3,4 anhydride is preferable from the viewpoints of light fastness, transparency, and workability.

The polycarboxylic acid is a compound having at least two carboxyl groups. The polycarboxylic acid is not particularly limited as long as a geometric isomer or an optical isomer is present in the following compound. As the polycarboxylic acid, a bifunctional to hexafunctional carboxylic acid is preferable. For example, an alkyltricarboxylic acid such as 1,2,3,4-butanetetracarboxylic acid, 1,2,3-propanetricarboxylic acid, 1,3,5-pentanetricarboxylic acid, or citric acid; an alicyclic polycarboxylic acid such as phthalic acid, hexahydrophthalic acid, methylhexahydrophthalic acid, tetrahydrophthalic acid, methyltetrahydrophthalic acid, cyclohexanetricarboxylic acid, nadic acid, or methylnadic acid; a polymer of an unsaturated fatty acid such as linolenic acid or oleic acid and a dimer which is a reduction product thereof; a linear alkyl diacid such as malic acid is preferable, hexanedioic acid, pentanedioic acid, heptanedioic acid, octanedioic acid, nonanedioic acid, or decanedioic acid is more preferable, and butanedioic acid is still more preferable from the viewpoint of heat resistance and transparency of a cured product.

The content of the acid anhydride and the polycarboxylic acid is preferably 0.01 to 20 parts by mass, more preferably 0.01 to 10 parts by mass, and still more preferably 0.1 to 6.0 parts by mass with respect to 100 parts by mass of the compound having an epoxy group.

<<Solvent>>

The curable composition according to the present invention may include a solvent. Examples of the solvent include an organic solvent. The solvent is not particularly limited as long as it satisfies the solubility of the respective components and the coating properties of the curable composition.

Preferable examples of the organic solvent are as follows:

an ester, for example, ethyl acetate, n-butyl acetate, cyclohexyl acetate, amyl formate, isoamyl acetate, isobutyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, or butyl oxyacetate (for example, methyl methoxyacetate, ethyl methoxyacetate, butyl methoxyacetate, methyl ethoxyacetate, or ethyl ethoxyacetate)), a 3-oxypropionic acid alkyl ester (for example, 3-methyl oxypropionate or 3-ethyl oxypropionate (for example, methyl 3-methoxypropionate, ethyl 3-methoxypropionate, methyl 3-ethoxypropionate, or ethyl 3-ethoxypropionate)), a 2-oxypropionic acid alkyl ester (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methylpropionate or ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate or ethyl 2-oxobutanoate;

an ether, for example, diethylene glycol dimethyl ether, tetrahydrofuran, ethylene glycol monomethyl ether, ethylene glycol monoethyl ether, methyl cellosolve acetate, ethyl cello solve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, or propylene glycol monopropyl ether acetate;

a ketone, for example, methyl ethyl ketone, cyclohexanone, cyclopentanone, 2-heptanone, or 3-heptanone; and an aromatic hydrocarbon, for example, toluene or xylene. In this case, it may be preferable that the content of the aromatic hydrocarbon (for example, benzene, toluene, xylene, or ethylbenzene) as the solvent is low (for example, 50 mass parts per million (ppm) or lower, 10 mass ppm or lower, or 1 mass ppm or lower with respect to the total mass of the organic solvent) in consideration of environmental aspects and the like.

Among these organic solvents, one kind may be used alone, or two or more kinds may be used in combination. In a case where two or more organic solvents are used in combination, in particular, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd.

Examples of a method of removing impurities such as metal from the solvent include distillation (for example, molecular distillation or thin-film distillation) and filtering using a filter. During the filtering using a filter, the pore size of a filter is preferably 10 nm or less, more preferably 5 nm or less, and still more preferably 3 nm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 10 to 90 mass %, more preferably 20 to 80 mass %, and still more preferably 25 to 75 mass % with respect to the total mass of the curable composition.

<<Surfactant>>

The curable composition according to the present invention may include various surfactants from the viewpoint of further improving coating properties. As the surfactants, various surfactants such as a fluorine surfactant, a nonionic surfactant, a cationic surfactant, an anionic surfactant, or a silicone surfactant can be used.

By the curable composition according to the present invention containing a fluorine surfactant, liquid characteristics (for example, fluidity) of a coating solution prepared from the coloring composition are further improved, and the uniformity in coating thickness and liquid saving properties can be further improved. That is, in a case where a film is formed using a coating solution prepared using the curable composition including a fluorine surfactant, the interfacial tension between a coated surface and the coating solution decreases, the wettability on the coated surface is improved, and the coating properties on the coated surface are improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-41318A (paragraphs "0060" to "0064" of corresponding WO2014/17669 and a surfactant described in paragraphs "0117" to "0132" of JP2011-132503A, the content of which is incorporated herein by reference. Examples of a commercially available product of the fluorine surfactant include: MEGAFACE F171, F172, F173, F176, F177, F141, F142, F143, F144, R30, F437, F475, F479, F482, F554, F780, and RS-72-K (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and PolyFox PF636, PF656, PF6320, PF6520, and PF7002 (all of which are manufactured by OMNOVA Solutions Inc.).

In addition, as the fluorine surfactant, an acrylic compound in which, when heat is applied to a molecular structure which has a functional group having a fluorine atom, the functional group is cut and a fluorine atom is vaporized can also be preferably used. As the acrylic compound in which, when heat is applied to a molecular structure which has a functional group having a fluorine atom, the functional group is cut and a fluorine atom is vaporized, MEGAFACE DS series (manufactured by DIC Corporation, The Chemical Daily, Feb. 22, 2016, Nikkei Business Daily, Feb. 23, 2016), for example, MEGAFACE DS-21 may be used.

As the fluorine surfactant, a block polymer can also be used, and specific examples thereof include a compound described in JP2011-89090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

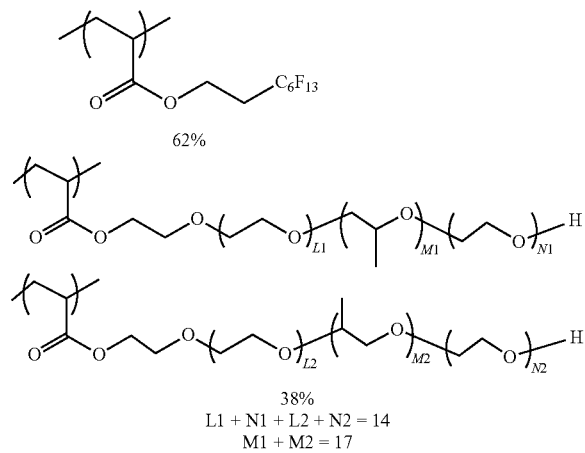

The weight-average molecular weight of the compound is preferably 3000 to 50000 and, for example, 14000. In the compound, "%" representing the proportion of a repeating unit is mass %.

In addition, a fluorine-containing polymer having an ethylenically unsaturated group at a side chain can also be preferably used as the fluorine surfactant. Specific examples include compounds described in paragraphs "0050" of "0090" and paragraphs "0289" to "0295" of JP2010-164965A, for example, MEGAFACE RS-101, RS-102, and RS-718K manufactured by DIC Corporation. As the fluorine surfactant, a compound described in paragraphs "0015" to "0158" of JP2015-117327A can also be used.

Specific examples of the nonionic surfactant include glycerol, trimethylolpropane, trimethylolethane, an ethoxylate and a propoxylate thereof (for example, glycerol propoxylate or glycerin ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 and TETRONIC 304, 701, 704, 901, 904, and 150R1 (all of which are manufactured by BASF SE)); and SOLSPERSE 20000 (manufactured by Lubrication Technology Inc.). In addition, NCW-101, NCW-1001, or NCW-1002 (manufactured by Wako Pure Chemical Industries, Ltd.) can also be used.

Specific examples of the cationic surfactant include an organosiloxane polymer KP341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Specific examples of the anionic surfactant include W004, W005, and W017 (manufactured by Yusho Co., Ltd.), and SANDET BL (manufactured by Sanyo Chemical Industries Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination.

The content of the surfactant is preferably 0.001 to 2.0 mass % and more preferably 0.005 to 1.0 mass % with respect to the total solid content of the curable composition.

<<Ultraviolet Absorber>>

It is preferable that the curable composition according to the present invention includes an ultraviolet absorber. The ultraviolet absorber is preferably a conjugated diene compound and more preferably a compound represented by the following Formula (I).

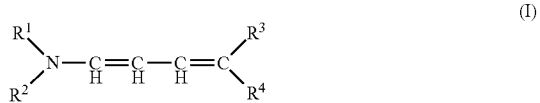

In Formula (I), $R^1$ and $R^2$ each independently represent a hydrogen atom, an alkyl group having 1 to 20 carbon atoms, or an aryl group having 6 to 20 carbon atoms, and may be the same as or different from each other but does not represent a hydrogen atom at the same time.

$R^1$ and $R^2$ may form a cyclic amino group with a nitrogen atom bonded to $R^1$ and $R^2$. Examples of the cyclic amino group include a piperidino group, a morpholino group, a pyrrolidino group, a hexahydroazepino group, and a piperazino group.

$R^1$ and $R^2$ each independently represent preferably an alkyl group having 1 to 20 carbon atoms, more preferably an alkyl group having 1 to 10 carbon atoms, and still more preferably an alkyl group having 1 to 5 carbon atoms.

$R^3$ and $R^4$ represent an electron-withdrawing group. Here, the electron-withdrawing group is an electron-withdrawing group having a Hammett substituent constant $\sigma_p$ value (hereinafter, simply referred to as "$\sigma_p$ value") of 0.20 to 1.0. The $\sigma_p$ value in the electron-withdrawing group is preferably 0.30 to 0.8.

It is preferable that $R^3$ represent a group selected from a cyano group, —COOR$^5$, —CONHR$^5$, —COR$^5$, and —SO$_2$R$^5$. It is preferable that $R^4$ represent a group selected from a cyano group, —COOR$^6$, —CONHR$^6$, —COR$^6$, and —SO$_2$R$^6$. $R^5$ and $R^6$ each independently represent an alkyl group having 1 to 20 carbon atoms or an aryl group having 6 to 20 carbon atoms.

$R^3$ and $R^4$ represent preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group. In addition, $R^3$ and $R^4$ may be bonded to each other to form a cyclic electron-withdrawing group. Examples of the cyclic electron-withdrawing group which is formed by $R^3$ and $R^4$ being bonded to each other include a 6-membered ring having two carbonyl groups.

At least one of $R^1$, $R^2$, $R^3$, or $R^4$ may represent a polymer obtained from a monomer which is bonded to a vinyl group through a linking group. At least one of $R^1$, $R^2$, $R^3$, or $R^4$ may represent a copolymer obtained from the above polymer and another monomer.

Specific examples of the ultraviolet absorber represented by Formula (I) include the following compounds. The description of a substituent of the ultraviolet absorber represented by Formula (I) can be found in paragraphs "0024" to "0033" of WO2009/123109A (corresponding to paragraphs "0040" to "0059" of US Patent App. No. 2011/0039195A), the content of which is incorporated herein by reference. Specific preferable examples of the compound represented by Formula (I) can be found in the description of Exemplary Compounds (1) to (14) in paragraphs "0034" to "0037" of WO2009/123109A (corresponding to paragraph "0060" of US Patent App. No. 2011/0039195A), the content of which is incorporated herein by reference.

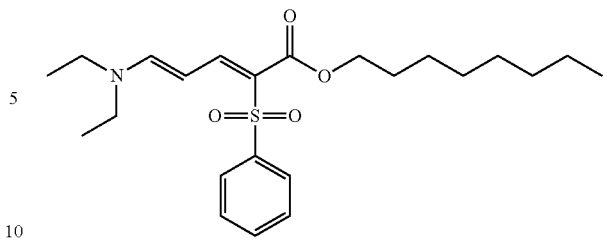

Examples of a commercially available product of the ultraviolet absorber include UV503 (manufactured by Daito Chemical Co., Ltd.). In addition, as the ultraviolet absorber, for example, avobenzone can also be used. In addition, UVINUL A (manufactured by BASF SE) can also be used. As the ultraviolet absorber, an ultraviolet absorber such as an amino diene compound, a salicylate compound, a benzophenone compound, a benzotriazole compound, an acrylonitrile compound, or a triazine compound can be preferably used. Specifically, a compound described in JP2013-68814A can be used. As the benzotriazole compound, MYUA series (manufactured by Miyoshi Oil&Fat Co., Ltd.; (The Chemical Daily, Feb. 1, 2016) may be used.

The content of the ultraviolet absorber is preferably 0.01 to 10 mass % and more preferably 0.01 to 5 mass % with respect to the total solid content of the curable composition according to the present invention.

<<Polymerization Inhibitor>>

The curable composition according to the present invention may include a polymerization inhibitor in order to prevent unnecessary thermal polymerization of the curable compound. Examples of the polymerization inhibitor include a phenol hydroxyl group-containing compound, a N-oxide compound, a piperidine-1-oxyl free-radical compound, a pyrrolidine-1-oxyl free-radical compound, a N-nitrosophenylhydroxyamine, a diazonium compound, a cationic dye, a sulfide group-containing compound, a nitro group-containing compound, a phosphorus compound, a lactone compound, and a transition metal compound (for example, FeCl$_3$ or CuCl$_2$). In addition, the compounds may be composite compounds in which a plurality of structures which exhibit a polymerization inhibition function such as a phenol skeleton or a phosphorus-containing skeleton are present in the same molecule. For example, a compound described in JP1998-46035A (JP-H10-46035A) is also preferably used. Specific examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine salt (for example, an ammonium salt or a cerium (III) salt). Among these, p-methoxyphenol is preferable.

The content of the polymerization inhibitor is preferably 0.01 to 5 mass % with respect to the total solid content of the curable composition.

<<Other Components>>

Optionally, the curable composition according to the present invention may further include a dispersant, a sensitizer, a curing accelerator, a filler, a thermal curing accelerator, a thermal polymerization inhibitor, a plasticizer, an adhesion accelerator, and other auxiliary agents (for example, conductive particles, a filler, an antifoaming agent, a flame retardant, a leveling agent, a peeling accelerator, an antioxidant, an aromatic chemical, a surface tension adjuster, or a chain transfer agent). By the near infrared absorbing composition appropriately including the components, desired stability, film properties, and the like of an optical filter such as a near infrared cut filter can be adjusted. The details of the components can be found in, for example, paragraph "0183" of JP2012-003225A (corresponding to "0237" of US Patent App. No. 2013/0034812A) and paragraphs "0101" to "0104" and "0107" to "0109" of JP2008-250074A, the content of which is incorporated herein by reference. In addition, examples of the antioxidant include a phenol compound, a phosphite compound, and a thioether compound. A phenol compound having a molecular weight of 500 or higher, a phosphite compound having a molecular weight of 500 or higher, or a thioether compound having a molecular weight of 500 or higher is more preferable. Among these compounds, a mixture of two or more kinds may be used. As the phenol compound, any phenol compound which is known as a phenol antioxidant can be used. As the phenol compound, for example, a hindered phenol compound is preferable. In particular, a compound having a substituent at a position (ortho-position) adjacent to a phenolic hydroxyl group is preferable. As the substituent, a substituted or unsubstituted alkyl group having 1 to 22 carbon atoms is preferable, and a methyl group, an ethyl group, a propionyl group, an isopropionyl group, a butyl group, an isobutyl group, a t-butyl group, a pentyl group, an isopentyl group, a t-pentyl group, a hexyl group, an octyl group, an isooctyl group, or a 2-ethylhexyl group is more preferable. In addition, a compound (antioxidant) having a phenol group and a phosphite group in the same molecule is also preferable. In addition, as the antioxidant, a phosphorus antioxidant can also be preferably used. Examples of the phosphorus antioxidant include at least one compound selected from the group consisting of tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-t-butyldibenzo[d,f][1,3,2]dioxaphosphepin-2-yl)oxy]ethyl]amine, and ethyl bis(2,4-di-t-butyl-6-methylphenyl)phosphite. The phosphorus antioxidant is easily commercially available, and examples of the commercially available product include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation). The content of the antioxidant is preferably 0.01 to 20 mass % and more preferably 0.3 to 15 mass % with respect to the mass of the total solid content of the curable composition. As the antioxidant, one kind may be used alone, or two or more kinds may be used. In a case where two or more polymerization initiators are used in combination, it is preferable that the total content of the two or more polymerization initiators is in the above-described range.

(Method of Preparing Curable Composition)

The curable composition according to the present invention can be prepared by mixing the above-described components with each other.

During the preparation of the curable composition, the respective components may be mixed with each other collectively, or may be mixed with each other sequentially after dissolved and dispersed in a solvent. In addition, during mixing, the order of addition or working conditions are not particularly limited. For example, all the components may be dissolved or dispersed in a solvent at the same time to prepare the composition. Optionally, two or more solutions or dispersions may be appropriately prepared using the respective components, and the solutions or dispersions may be mixed with each other during use (during application) to prepare the curable composition.

During the preparation of the curable composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 µm and is preferably about 0.01 to 3.0 µm and more preferably about 0.05 to 0.5 µm. In the above-described range, fine foreign matter, which inhibits preparation of a fine and smooth composition in the next step, can be reliably removed. In addition, a fibrous filter material is also preferably used, and examples of the filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation.

A second filter may be formed of the same material as that of the first filter.

For example, the filtering using the first filter may be performed only on the dispersion, and the filtering using the second filter may be performed on a mixture of the dispersion and other components.

For example, in a case where a film is formed by coating, the viscosity (23° C.) of the curable composition according to the present invention is preferably in a range of 1 to 3000 mPa·s. The lower limit is preferably 3 mPa·s or higher and more preferably 5 mPa·s or higher. The upper limit is preferably 2000 mPa·s or lower and more preferably 1000 mPa·s or lower.

For example, the curable composition according to the present invention can also be used, for example, for a near infrared cut filter (for example, a near infrared cut filter for a wafer level lens) on a light receiving side of a solid image pickup element or as a near infrared cut filter on a back surface side (opposite to the light receiving side) of a solid image pickup element. In addition, the curable composition according to the present invention may be directly applied to an image sensor to form a coating film. The curable composition according to the present invention can be supplied in an applicable state. Therefore, a near infrared cut filter can be easily formed on a desired member or position of a solid image pickup element.

In addition, the curable composition according to the present invention may be applied to a glass substrate or a layer containing copper.

<Cured Film>

Next, a cured film according to the present invention will be described. The cured film according to the present invention is formed using the above-described curable composition according to the present invention. The cured film according to the present invention can be preferably used as a near infrared cut filter or an infrared transmitting filter. In addition, the film according to the present invention can also be used as a heat ray shielding filter. The cured film according to the present invention may be a film having a pattern or a film (flat film) not having a pattern. In addition, the cured film according to the present invention may be used in a state where it is laminated on a support, or the cured film according to the present invention may be peeled off from a support. In a case where the cured film according to the present invention is used as an infrared transmitting filter, examples of the infrared transmitting filter include a filter that shields visible light and allows transmission of light in a wavelength range of 900 nm or longer. In a case where the cured film according to the present invention is used as an infrared transmitting filter, it is preferable that infrared transmitting filter is a filter that is formed of a curable composition including the near infrared absorbing compound A and the coloring material that shields visible light (preferably a coloring material including two or more chromatic colorants or a coloring material including at least an organic black colorant), or is a filter in which a layer of the coloring material that shields visible light is separately present in addition to a layer including the near infrared absorbing compound A. In a case where the cured film according to the present invention is used as an infrared transmitting filter, the near infrared absorbing compound A has a function of limiting light to be transmitted (near infrared light) to a long wavelength side.

The thickness of the cured film according to the present invention can be adjusted according to the purpose. The thickness is preferably 20 µm or less, more preferably 10 µm or less, and still more preferably 5 µm or less. For example, the lower limit of the thickness is preferably 0.1 µm or more, more preferably 0.2 µm or more, and still more preferably 0.3 µm or more.

The cured film according to the present invention can be used in combination with a color filter that includes a chromatic colorant. The color filter can be manufactured using a coloring composition including a chromatic colorant. Examples of the chromatic colorant include the chromatic colorants described regarding the curable composition according to the present invention. The coloring composition may further include, for example, a resin, a curable compound, a photopolymerization initiator, a surfactant, a solvent, a polymerization inhibitor, and an ultraviolet absorber. In more detail, for example, the materials described above regarding the curable composition according to the present invention can be used. In addition, the cured film according to the present invention may have not only a function as a near infrared cut filter but also a function as a color filter by including a chromatic colorant.

In the present invention, "near infrared cut filter" refers to a filter that allows transmission of light (visible light) in the visible range and shields at least a part of light (near infrared light) in the near infrared range. The near infrared cut filter may be a filter that allows transmission of light in the entire wavelength range of the visible range, or may be a filter that allows transmission of light in a specific wavelength range of the visible range and shields light in another specific wavelength range of the visible range. In addition, in the present invention, "color filter" refers to a filter that allows transmission of light in a specific wavelength range of the visible range and shields light in another specific wavelength range of the visible range. In addition, "infrared transmitting filter" refers to a filter that shields light (visible light) in the visible range and allows transmission of at least a part of light (near infrared light) in the near infrared range.

In a case where the cured film according to the present invention is used as a near infrared cut filter, the near infrared cut filter may further include, for example, a layer containing copper, a dielectric multi-layer film, or an ultraviolet absorbing layer in addition to the cured film according to the present invention.

By further including the layer containing copper or the dielectric multi-layer film, the near infrared cut filter according to the present invention having a wide viewing angle and excellent infrared shielding properties can be easily obtained. In addition, by including the ultraviolet absorbing layer, the cured film according to the present invention can function as a near infrared cut filter having excellent ultraviolet shielding properties. Examples of the ultraviolet absorber included in the ultraviolet absorbing layer include the ultraviolet absorbers described regarding the curable composition according to the present invention. In addition, the details of the ultraviolet absorbing layer can be found in the description of an absorbing layer described in paragraphs "0040" to "0070" and paragraphs "0119" to "0145" of WO2015/099060. The details of the dielectric multi-layer film can be found in paragraphs "0255" to "0259" of JP2014-41318A As the layer containing copper, a glass substrate (copper-containing glass substrate) formed of glass containing copper, or a layer (copper complex-containing layer) containing a copper complex may also be used. Examples of a glass substrate including copper include a phosphate glass including copper and a fluorophosphate glass including copper. Examples of a commercially available product of the glass including copper include NF-50 (trade name, manufactured by AGC Techno Glass Co., Ltd.), BG-60 and BG-61 (trade names, both of which are manufactured by Schott AG), and CD5000 (trade name, manufactured by Hoya Corporation). Examples of a copper complex-containing layer include a layer that is formed using a copper complex-containing composition including a copper complex. The copper complex is preferably a compound having an absorption maximum in a wavelength range of 700 to 1200 nm. It is more preferable the absorption maximum of the copper complex is present in a wavelength range of 720 to 1200 nm, and it is still more preferable the absorption maximum of the copper complex is present in a wavelength range of 800 to 1100 nm.

In a case where the cured film according to the present invention is used as a near infrared cut filter or an infrared transmitting filter, a near infrared cut filter and an infrared transmitting filter can be used in combination. By using a near infrared cut filter and an infrared transmitting filter in combination, this combination can be preferably used for an infrared sensor that detects infrared light at a specific wavelength. In a case where both an infrared cut filter and an infrared transmitting filter are used in combination, either or both of the near infrared cut filter and the infrared transmitting filter can be formed using the curable composition according to the present invention.

The cured film according to the present invention can be used in various devices including a solid image pickup element such as a charge coupled device (CCD) or a complementary metal-oxide semiconductor (CMOS), an infrared sensor, or an image display device. The cured film according to the present invention can be used, for example, as a lens that has a function of absorbing and cutting near infrared light (a camera lens for a digital camera, a mobile phone, or a vehicle-mounted camera, or an optical lens such as an a f-θ lens or a pickup lens), an optical filter for a semiconductor light-receiving element, an agricultural coating agent for selective use of sunlight, a recording medium using heat absorbed from near infrared light, a near infrared light for an electronic apparatus or a picture, an eye protector, sunglasses, a heat ray shielding filter, a filter for reading and recording an optical character, a filter for preventing classified documents from being copied, an electrophotographic photoreceptor, or a filter for laser welding. In addition, the near infrared cut filter according to the present invention is also useful as a noise cut filter for a CCD camera or a filter for a CMOS image sensor.

<Pattern Forming Method>

Next, a pattern forming method will be described. The pattern forming method includes: a step of forming a composition layer on a support using the curable composition according to the present invention; and a step of forming a pattern on the composition layer using a photolithography method or a dry etching method.

In a case where a laminate in which the cured film according to the present invention and a color filter are laminated is manufactured, pattern formation on the cured film according to the present invention and pattern formation on the color filter may be separately performed. In addition, pattern formation may be performed on the laminate in which the cured film according to the present invention and the color filter are laminated (that is, pattern formation on the cured film according to the present invention and pattern formation on the color filter may be simultaneously performed).

The case where pattern formation on the cured film according to the present invention and pattern formation on the color filter are separately performed denotes the following aspect. Pattern formation is performed on any one of the cured film according to the present invention and the color filter. Next, the other filter layer is formed on the filter layer on which the pattern is formed. Next, pattern formation is performed on the filter layer on which a pattern is not formed.

The pattern forming method may be a pattern forming method using photolithography or a pattern forming method using dry etching.

In a case where the pattern formation on the cured film according to the present invention and the pattern formation on the color filter are separately performed, the pattern formations on the respective filter layers may be performed using only the photolithography method or only the dry etching method. In addition, after performing the pattern formation on one filter layer using the photolithography method, the pattern formation may be performed on the other filter layer using the dry etching method. In a case where the pattern formation is performed using a combination of the dry etching method and the photolithography method, it is preferable that a pattern is formed on a first layer using the dry etching method and a pattern is formed on a second or subsequent layer using the photolithography method.

It is preferable that the pattern formation using the photolithography method includes: a step of forming a composition layer on a support using each composition; a step of exposing the composition layer in a pattern shape; and a step of forming a pattern by removing a non-exposed portion by development. Optionally, the pattern formation further includes: a step (pre-baking step) of baking the composition layer; and a step (post-baking step) of baking the developed pattern.

In addition, It is preferable that the pattern formation using the dry etching method includes: a step of forming a composition layer on a support using each composition and curing the composition layer to form a cured composition layer; a step of forming a photoresist layer on the cured composition layer; a step of obtaining a resist pattern by patterning the photoresist layer by exposure and development; and a step of forming a pattern by dry-etching the cured composition layer by using the resist pattern as an etching mask. Hereinafter, the respective steps will be described.

<<Step of Forming Composition Layer>>

In the step of forming a composition layer, a composition layer is formed on a support using each of the compositions.

As the support, for example, a substrate for a solid image pickup element obtained by providing a solid image pickup element (light-receiving element) such as CCD or CMOS on a substrate (for example, a silicon substrate) can be used.

Optionally, an undercoat layer may be provided on the support to improve adhesion with a layer above the support, to prevent diffusion of materials, or to make a surface of the substrate flat.

As a method of applying the composition to the support, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using metal or the like; and a nanoimprint lithography method. The application method using an ink jet method is not particularly limited as long as the composition can be jetted using this method, and examples thereof include a method (in particular, pp. 115 to 133) described in "Extension of Use of Ink Jet—Infinite Possibilities in Patent—" (February, 2005, S.B. Research Co., Ltd.) and methods described in JP2003-262716A, JP2003-185831A, JP2003-261827A, JP2012-126830A, and JP2006-169325A.

The composition layer formed on the support may be dried (pre-baked). In a case where a pattern is formed through a low-temperature process, pre-baking is not necessarily performed.

In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 to 300 seconds, more preferably 40 to 250 seconds, and still more preferably 80 to 220 seconds. Drying can be performed using a hot plate, an oven, or the like.

In a case where the pattern formation is simultaneously performed on a plurality of layers, it is preferable that a composition for forming each of the layers is applied to the composition layer to form another composition layer.

(Case Where Pattern is Formed Using Photolithography Method)

<<Exposure Step>>

Next, the composition layer is exposed in a pattern shape (exposure step). For example, the composition layer is exposed in a pattern shape using an exposure device such as a stepper through a mask having a predetermined mask pattern, thereby exposing a pattern. As a result, an exposed portion can be cured.

As radiation (light) used during the exposure, ultraviolet rays such as g-rays or i-rays are preferably used (i-rays are more preferably used). The irradiation dose (exposure dose) is preferably 0.03 to 2.5 $J/cm^2$, more preferably 0.05 to 1.0 $J/cm^2$, and most preferably 0.08 to 0.5 $J/cm^2$.

The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol % or higher, preferably 30 vol % or higher, or more preferably 50 vol % or higher). In addition, the exposure illuminance can be appropriately set and typically can be selected in a range of 1000 $W/m^2$ to 100000 $W/m^2$ (for example, 5000 $W/m^2$, 15000 $W/m^2$, or 35000 $W/m^2$). Conditions of the oxygen concentration and conditions of the exposure illuminance may be appropriately combined. For example, conditions are oxygen concentration: 10 vol % and illuminance: 10000 $W/m^2$, or oxygen concentration: 35 vol % and illuminance: 20000 $W/m^2$.

<<Development Step>>

Next, a pattern is formed by removing a non-exposed portion by development. The non-exposed portion can be removed by development using a developer. As a result, a non-exposed portion of the composition layer in the exposure step is eluted into the developer, and only the photo-cured portion remains.

As the developer, an organic alkali developer which does not cause damages to a solid image pickup element as a substrate, a circuit or the like is desired.

For example, the temperature of the developer is preferably 20° C. to 30° C. The developing time is preferably 20 to 180 seconds. In addition, in order to further improve residue removing properties, a step of shaking the developer off per 60 seconds and supplying a new developer may be repeated multiple times.

Examples of an alkaline agent used in the organic alkali developer include an organic alkaline agent such as ammonia water, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, 1,8-diazabicyclo[5,4,0]-7-undecene, or dimethyl bis(2-hydroxyethyl)ammonium hydroxide. As the developer, an alkaline aqueous solution can be preferably used in which the above alkaline agent is diluted with pure water such that a concentration thereof is 0.001 to 10 mass % and preferably 0.01 to 1 mass %.

In addition, an inorganic alkaline agent may be used as the developer. Preferable examples of the inorganic alkaline agent include sodium hydroxide, potassium hydroxide, sodium carbonate, sodium bicarbonate, sodium silicate, and sodium metasilicate.

In addition, a surfactant may be used as the developer. Examples of the surfactant include the surfactants described above regarding the curable composition. Among these, a nonionic surfactant is preferable.

In a case where a developer including the alkaline aqueous solution is used, in general, it is preferable that the film is rinsed with pure water after development.

After the development, it is preferable that the film is dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and even still more preferably 90° C. or lower. The lower limit is, for example, 50° C. or higher. The film after the development is post-baked continuously or batch-wise using heating means such as a hot plate, a convection oven (hot air circulation dryer), a high-frequency heater under the above-described conditions. In addition, in a case where a pattern is formed through a low-temperature process, post-baking is not necessarily performed.

(Case Where Pattern is Formed Using Dry Etching Method)

The pattern formation using the dry etching method can be performed by curing the composition layer formed on the support to form a cured composition layer, and then etching the cured composition layer with etching gas by using a patterned photoresist layer as a mask. Specifically, it is preferable that a positive type or negative type radiation sensitive composition is applied to the cured composition layer and is dried such that a photoresist layer is formed. It is preferable that pre-baking is further performed in order to form the photoresist layer. In particular, in a preferable aspect, as a process of forming the photoresist, baking after exposure or baking after development (post-baking) is performed. The details of the pattern formation using the dry etching method can be found in paragraphs "0010" to "0067" of JP2013-064993A, the content of which is incorporated herein by reference.

<Optical Filter>

Next, an optical filter according to the present invention will be described. The optical filter according to the present invention includes the cured film according to the present invention. The optical filter according to the present invention can be preferably used as at least one selected from the group consisting of a near infrared cut filter and an infrared transmitting filter. In addition, it is also preferable that the optical filter according to the present invention includes a pixel which is formed using the cured film according to the present invention and a pixel selected from the group consisting of a red pixel, a green pixel, a blue pixel, a magenta pixel, a yellow pixel, a cyan pixel, a black pixel, and an achromatic pixel <Laminate>

In addition, a laminate according to the present invention includes: the cured film according to the present invention; and a color filter that includes a chromatic colorant. In the laminate according to the present invention, the cured film according to the present invention and the color filter may be or may not be adjacent to the color filter in the thickness direction. In a case where the cured film according to the present invention is not adjacent to the color filter in the thickness direction, the cured film according to the present invention may be formed on another substrate other than a substrate on which the color filter is formed, or another member (for example, a microlens or a planarizing layer) constituting a solid image pickup element may be interposed between the cured film according to the present invention and the color filter.

<Solid Image Pickup Element>

A solid image pickup element according to the present invention includes the cured film according to the present invention. The solid image pickup element according to the present invention is configured to include the cured film according to the present invention. The configuration of the solid image pickup element is not particularly limited as long as the solid image pickup element functions. For example, the following configuration can be adopted.

The solid image pickup element includes plural photodiodes and transfers electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the cured film according to the present invention is formed on the device protective film.

Further, a configuration in which light collecting means (for example, a microlens; hereinafter, the same shall be applied) is provided above the device protective film and below the cured film according to the present invention (on a side thereof close the support), or a configuration in which light collecting means is provided on the cured film according to the present invention may be adopted.

In addition, in the solid image pickup element, the color filter may have a structure in which a cured film which forms each color pixel is embedded in a space which is partitioned in, for example, a lattice shape by a partition wall. In this case, it is preferable that the partition wall has a low refractive index with respect to each color pixel. Examples of an imaging device having such a structure include a device described in JP2012-227478A and JP2014-179577A.

<Image Display Device>

The cured film according to the present invention can also be used in an image display device such as a liquid crystal display device or an organic electroluminescence (organic EL) display device. For example, by using the near infrared cut filter in combination with the respective colored pixels (for example, red, green, blue), the near infrared cut filter can be used for the purpose of shielding infrared light included in light emitted from a backlight (for example, a white light emitting diode (white LED)) of a display device to prevent a malfunction of a peripheral device, or for the purpose of forming an infrared pixel in addition to the respective color display pixels.

The definition of the image display device and the details of each image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques".

The image display device may include a white organic EL element. It is preferable that the white organic EL element has a tandem structure. The tandem structure of the organic EL element is described in, for example, JP2003-45676A, or pp. 326-328 of "Forefront of Organic EL Technology Development—Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

<Infrared Sensor>

An infrared sensor includes the cured film according to the present invention. The configuration of the infrared sensor is not particularly limited as long as it includes the cured film according to the present invention and functions as an infrared sensor.

Hereinafter, an embodiment of the infrared sensor according to the present invention will be described using the drawings.

In FIG. 1, reference numeral 110 represents a solid image pickup element. In an imaging region provided on a solid image pickup element 110, near infrared cut filters 111 and infrared transmitting filters 114 are provided. In addition, color filters 112 are laminated on the near infrared cut filters 111. Microlenses 115 are disposed on an incidence ray hv side of the color filters 112 and the infrared transmitting filters 114. A planarizing layer 116 is formed so as to cover the microlenses 115.

Characteristics of the near infrared cut filters 111 can be selected depending on the emission wavelength of an infrared light emitting diode (infrared LED) described below. For example, it is preferable that the infrared cut filters 111 is a filter that allows transmission of visible light (for example, light in a wavelength range of 400 to 650 nm) and shields at least a part of light in a wavelength range of longer than 700 nm (preferably at least a part of light in a wavelength range of 700 to 1300 nm and more preferably at least a part of light in a wavelength range of 700 to 1000 nm). The near infrared cut filter 111 can be formed using, for example, the curable composition according to the present invention.

The color filters 112 is not particularly limited as long as pixels which allow transmission of light having a specific wavelength in the visible range and absorbs the light are formed therein, and well-known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected depending on the emission wavelength of the infrared LED described below. For example, in a case where the emission wavelength of the infrared LED is 850 nm, a maximum value of a light transmittance of the infrared transmitting filter 114 in the thickness direction of the film in a wavelength range of 400 to 650 nm is preferably 30% or lower, more preferably 20% or lower, still more preferably 10% or lower and even still more preferably 0.1% or lower. It is preferable that the transmittance satisfies the above-described conditions in the entire wavelength range of 400 to 650 nm. The maximum value of the light transmittance in a wavelength range of 400 to 650 nm is typically 0.1% or higher.

A minimum value of a light transmittance of the infrared transmitting filter 114 in the thickness direction of the film in a wavelength range of 800 nm or longer (preferably 800 to 1300 nm) is preferably 70% or higher, more preferably 80% or higher, and still more preferably 90% or higher. It is preferable that the transmittance satisfies the above-described conditions in at least a part of a wavelength range of 800 nm or longer, and it is more preferable that the transmittance satisfies the above-described conditions at a wavelength corresponding to the emission wavelength of the infrared LED. The minimum value of the light transmittance in a wavelength range of 900 to 1300 nm is typically 99.9% or lower.

The thickness of the infrared transmitting filter 114 is preferably 100 µm or less, more preferably 15 µm or less, still more preferably 5 µm or less, and even still more preferably 1 µm or less. The lower limit value is preferably 0.1 µm. In a case where the thickness is in the above-described range, the film can satisfy the above-described spectral characteristics.

A method of measuring the spectral characteristics, the thickness, and the like of the infrared transmitting filter 114 is as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 to 1300 nm using a spectrophotometer (U-4100, manufactured by Hitachi High-Technologies Corporation).

The infrared transmitting filter 114 having the above-described spectral characteristics can be formed using a curable composition including the coloring material that shields visible light. The details of the coloring material that shields visible light are the same as the range described above regarding the curable composition according to the present invention.

In addition, for example, in a case where the emission wavelength of the infrared LED is 940 nm, it is preferable that a maximum value of a light transmittance of the infrared transmitting filter 114 in a thickness direction in a wavelength range of 450 to 650 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1000 to 1300 nm is 70% or higher.

The infrared transmitting filter 114 having the above-described spectral characteristics can be manufactured using a curable composition including the coloring material that shields visible light and a compound having an absorption maximum in a wavelength range of 750 to 950 nm. The details of the coloring material that shields visible light are the same as the range described above regarding the curable composition according to the present invention. Examples of the near infrared absorbing compound include the near infrared absorbing compound A and the other near infrared absorbing compounds described above regarding the curable composition according to the present invention. In addition, the infrared transmitting filter 114 can also be formed using the curable composition according to the present invention including the coloring material that shields visible light.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "%" and "part(s)" represent "mass %" and "part(s) by mass".

Test Example 1

<Preparation of Curable Composition>

Examples 1 to 31 and Comparative Examples 1 to 4

The following components were mixed with each other to prepare each of curable compositions according to Examples 1 to 31 and Comparative Examples 1 to 4. In Example 26, 1.2 parts of S-33 and 1.2 parts of S-34 were used as near infrared absorbing compounds. In addition, in Examples 27 to 30, 15.6 parts of a resin 1 and 10.4 parts of a curable compound were used.

(Composition)

Near infrared absorbing compound (a compound shown in Table 12 below): 2.3 parts Resin 1 (a resin having the following structure; Mw=11500; a ration in a repeating unit is a molar ratio; synthesized using a method described in paragraphs "0247" to "0249" of JP2012-198408A: 12.9 parts

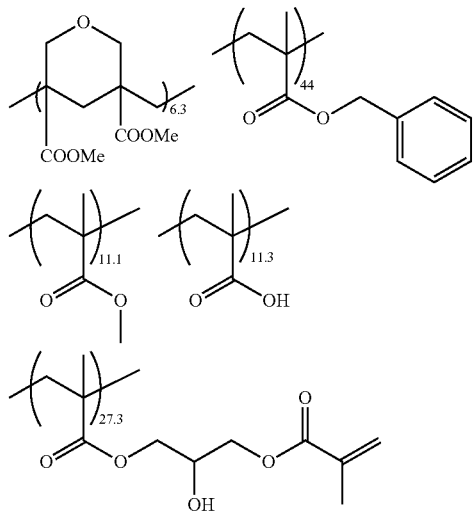

Curable compound: dipentaerythritol hexaacrylate (trade name: KAYARAD DPHA, manufactured by Nippon Kayaku Co., Ltd.): 12.9 parts Photopolymerization initiator: IRGACURE OXE01 [2-(O-benzoyloxime)-1-[4-(phenylthio)phenyl]-1,2-octane-dione] (manufactured by BASF SE): 2.5 parts Ultraviolet absorber: UV503 (manufactured by Daito Chemical Co., Ltd.): 0.5 parts Surfactant (the following mixture (Mw=14000); in the following formula, "%" representing the proportion of a repeating unit is mass %): 0.04 parts

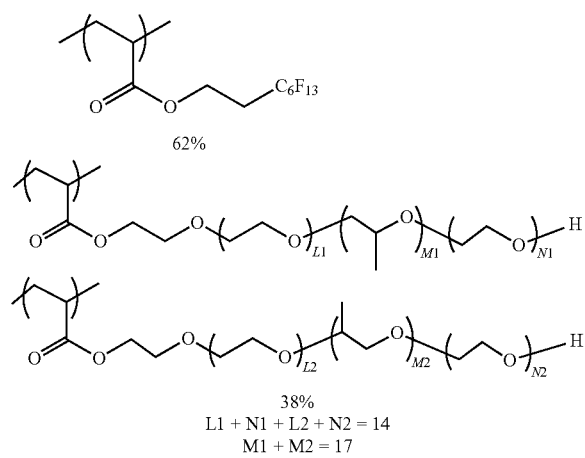

Polymerization inhibitor: p-methoxyphenol: 0.006 parts
Cyclohexanone: 49.6 parts
Propylene glycol monomethyl ether acetate: 19.3 parts
Additive W (a compound shown in the following table (a salt of an anion)): a mol number shown in Table 12 below with respect to 1 mol of the near infrared absorbing compound

TABLE 12

| Example | Near Infrared Absorbing Compound | Additive W Type | Addition Amount |
|---|---|---|---|
| Example 1 | S-1 | W-1 | 1.0 mol |
| Example 2 | S-7 | W-1 | 3.0 mol |
| Example 3 | I-3 | W-1 | 1.0 mol |
| Example 4 | S-26 | W-1 | 1.0 mol |
| Example 5 | S-34 | W-1 | 1.0 mol |
| Example 6 | S-36 | W-1 | 3.0 mol |
| Example 7 | D-3 | W-1 | 1.0 mol |
| Example 8 | S-26 | W-1 | 1.0 mol |
| Example 9 | S-26 | W-1 | 5.0 mol |
| Example 10 | S-26 | W-2 | 1.0 mol |
| Example 11 | S-26 | W-3 | 1.0 mol |
| Example 12 | I-3 | W-4 | 1.0 mol |
| Example 13 | S-1 | W-5 | 1.0 mol |
| Example 14 | S-34 | W-6 | 1.0 mol |
| Example 15 | S-36 | W-7 | 1.0 mol |
| Example 16 | S-26 | W-8 | 1.0 mol |
| Example 17 | S-26 | W-9 | 1.0 mol |
| Example 18 | S-26 | W-10 | 1.0 mol |
| Example 19 | S-36 | W-11 | 1.0 mol |
| Example 20 | I-3 | W-12 | 1.0 mol |
| Example 21 | D-3 | W-1 | 5.0 mol |
| Example 22 | D-7 | W-2 | 1.0 mol |
| Example 23 | S-26 | W-1 | 0.03 mol |
| Example 24 | S-26 | W-1 | 6.0 mol |
| Example 25 | S-26 | W-1/W-3 | 1.0 mol/1.0 mol |
| Example 26 | S-33 (1.2 parts)/S-34 (1.2 parts) | W-4 | 1.0 mol |
| Example 27 | S-1 | W-1 | 1.0 mol |
| Example 28 | I-3 | W-6 | 1.0 mol |
| Example 29 | S-26 | W-10 | 1.0 mol |
| Example 30 | D-8 | W-2 | 1.0 mol |
| Example 31 | S-26 | W-13 | 0.5 mol |
| Comparative Example 1 | S-17 | — | — |
| Comparative Example 2 | D-1 | — | — |
| Comparative Example 3 | S-17 | W-14 | 0.5 mol |
| Comparative Example 4 | D-1 | W-14 | 0.5 mol |

(Near Infrared Absorbing Compound)

In Table 12 the near infrared absorbing compounds S-1, S-7, S-17, S-26, S-33, S-34, S-36, 1-3, D-1, D-3, D-7, and D-8 are the compounds described above as the specific examples of the cyanine compound and the diimmonium compound.

(Additive W)

W-1 to W-13: compounds having the following structures (salts of anions) (in W-1 to W-11, the conjugate acid pKa of each of the anions is −16.4; in W-2, W-3, W-4, and W-5, the conjugate acid pKa of each of the anions is −11.9; in W-6, the conjugate acid pKa of the anion is −12.2; in W-8, the conjugate acid pKa of the anion is −13.1; in W-9, the conjugate acid pKa of the anion is −13.3; and in W-7, W-10, W-12, and W-13, the conjugate acid pKa of each of the anions is −8 or lower)

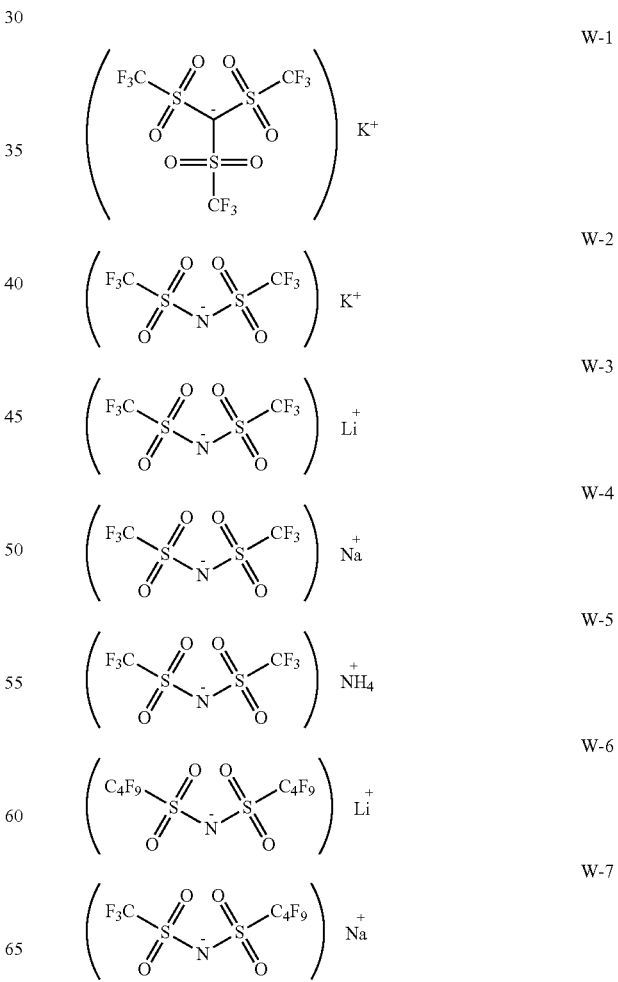

-continued

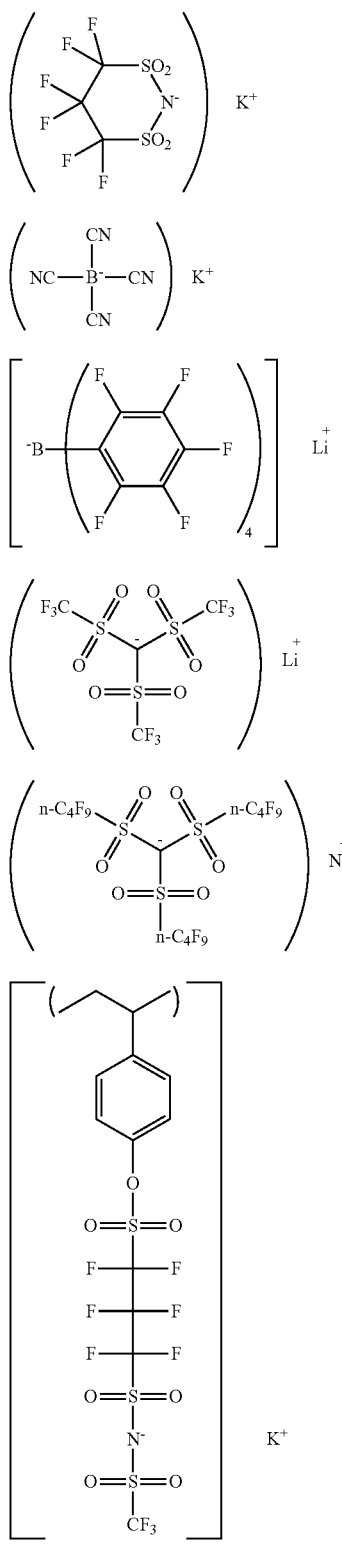

W-14: KI (potassium iodide, the conjugate acid pKa of the anion is −7.7)

<Preparation of Near Infrared Cut Filter>

Each of the curable compositions was applied to a glass substrate (1737, manufactured by Corning Inc.) using a spin coater (manufactured by Mikasa Co., Ltd.) such that the thickness of a dried film was 0.8 μm, and was heated (pre-baked) using a hot plate at 100° C. for 120 seconds. Next, the glass substrate was exposed using an i-ray stepper exposure device FPA-3000 i5+ (manufactured by Canon Corporation) at 500 mJ/cm². As a result, a near infrared cut filter was manufactured.

Example 32

4.6 parts of the near infrared absorbing compound S-26, 2.3 parts of an additive W-1, 50.0 parts of a compound having an epoxy group (MARPROOF G-0150M, manufactured by NOF Corporation, weight-average molecular weight: 10000), and 100 parts of methyl ethyl ketone were mixed with each other and were stirred and dissolved at 20° C. to 35° C. to be homogeneous. Further, 0.500 parts (1 part with respect to 100 parts by mass of the compound having an epoxy group) of butanedioic acid was added, and the components were stirred at 20° C. to 35° C. for 1 hour. As a result a curable composition according to Example 32 was obtained. This curable composition was applied to a glass substrate using a spin coater (manufactured by Mikasa Co., Ltd.) such that the thickness after drying was 0.8 μm, and then was dried at 80° C. for 10 minutes to remove the solvent. Next, the film formed on the glass substrate was thermally cured at 150° C. for 3 hours. As a result, a near infrared cut filter was prepared.

Example 33

A near infrared cut filter was obtained using the same method as in Example 32, except that the near infrared absorbing compound S-36 was used instead of the near infrared absorbing compound S-26.

<Evaluation of Heat Resistance>

The obtained near infrared cut filter was heated using a hot plate at 230° C. (or 120° C.) for 5 minutes. Next, a ΔEab value of a color difference of the near infrared cut filter before and after heating was measured using a colorimeter MCPD-1000 (manufactured by Otsuka Electronics Co., Ltd.) and was evaluated based on the following criteria. The lower the ΔEab value, the higher the heat resistance.

In Examples 1 to 6, 8 to 20, 23 to 29, and 31 to 33 and Comparative Examples 1 and 3 in which the cyanine compound was used, the heat treatment was performed at 230° C. In addition, in Examples 7, 21, 22, and 30 and Comparative Examples 2 and 4 in which the diimmonium compound was used, the heat treatment was performed at 120° C.

The ΔEab value was obtained from the following color difference formula of CIE (Commission Internationale de l'Eclairage) 1976 (L*, a*, b*) color space (Handbook of Color Science, p. 266, 1985, edited by The Color Science Association Of Japan).

$$\Delta Eab = \{(\Delta L^*)^2 + (\Delta a^*)^2 + (\Delta b^*)^2\}^{1/2}$$

5: ΔEab Value<3
4: 3≤ΔEab Value<5
3: 5≤ΔEab Value<10
2: 10≤ΔEab Value<20
1: 20≤ΔEab Value <Evaluation of Surface Unevenness>

The obtained near infrared cut filter was heated using a hot plate at 150° C. for 5 minutes. Regarding the near infrared cut filter after the heat treatment, whether or not unevenness was observed on the film surface was observed using an optical microscope (MX-61L, manufactured by Olympus Corporation) in a bright field at 200 times.

A: no unevenness was observed on the film surface

B: unevenness was slightly observed on the film surface

C: unevenness was strongly observed on the film surface

<Evaluation of Visible Transparency>

The obtained near infrared cut filter was heated using a hot plate at 150° C. for 5 minutes. Regarding the near infrared cut filter after the heat treatment, a transmittance in a wavelength range of 500 to 600 nm was measured using a spectrophotometer U-4100 (manufactured by Hitachi High-Technologies Corporation). The visible transparency was evaluated based on the following criteria. The results are shown in the following table.

A: 90%≤minimum value of transmittance at a wavelength of 500 to 600 nm

B: 80%≤minimum value of transmittance at a wavelength of 500 to 600 nm<90%

C: 70%≤minimum value of transmittance at a wavelength of 500 to 600 nm<80%

D: minimum value of transmittance at a wavelength of 500 to 600 nm<70%

TABLE 13

| Example | Heat Resistance | Surface Unevenness | Visible Transparency |
|---|---|---|---|
| Example 1 | 4 | A | A |
| Example 2 | 4 | A | A |
| Example 3 | 4 | A | A |
| Example 4 | 4 | A | A |
| Example 5 | 4 | A | A |
| Example 6 | 4 | A | A |
| Example 7 | 4 | A | B |
| Example 8 | 4 | A | A |
| Example 9 | 5 | A | A |
| Example 10 | 4 | A | A |
| Example 11 | 4 | A | A |
| Example 12 | 4 | A | A |
| Example 13 | 4 | A | A |
| Example 14 | 4 | A | A |
| Example 15 | 4 | A | A |
| Example 16 | 4 | A | A |
| Example 17 | 4 | A | A |
| Example 18 | 4 | A | A |
| Example 19 | 4 | A | A |
| Example 20 | 4 | A | A |
| Example 21 | 5 | A | B |
| Example 22 | 4 | A | B |
| Example 23 | 3 | A | A |
| Example 24 | 5 | B | A |
| Example 25 | 5 | A | A |
| Example 26 | 4 | A | A |
| Example 27 | 4 | A | A |
| Example 28 | 4 | A | A |
| Example 29 | 4 | A | A |
| Example 30 | 4 | A | A |
| Example 31 | 3 | A | A |
| Example 32 | 4 | A | A |
| Example 33 | 4 | A | A |
| Comparative Example 1 | 2 | A | A |
| Comparative Example 2 | 2 | A | B |
| Comparative Example 3 | 2 | C | A |
| Comparative Example 4 | 2 | C | B |

It was found based on the above results that, in Examples, heat resistance was excellent. Further, the evaluation results of the surface shape were also excellent. On the other hand, in Comparative Examples, the heat resistance was lower than that in Examples.

In Examples, by further adding a coloring material that shields visible light, an infrared transmitting filter having excellent spectral variation resistance was obtained.

Test Example 2

Example 101

The curable composition according to Example 1 was applied to a silicon wafer using a spin coating method such that the thickness of the formed film was 1.0 µm, and then was heated using a hot plate at 100° C. for 2 minutes. Next, the silicon wafer was heated using a hot plate at 200° C. for 5 minutes. Next, a 2 µm Bayer pattern (near infrared cut filter) was formed using a dry etching method.

Next, a curable composition including a red pigment (hereinafter, referred to as "Red composition") was applied to the Bayer pattern of the near infrared cut filter using a spin coating method such that the thickness of the formed film was 1.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm dot pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the washed silicon wafer was heated using a hot plate at 200° C. for 5 minutes. As a result, a cured film of the Red composition was patterned on the Bayer pattern of the near infrared cut filter. Using the same method, a cured film of a curable composition including a green pigment (hereinafter, referred to as "Green composition") and a cured film of a curable composition including a blue pigment (hereinafter, referred to as "Blue composition") were sequentially patterned to form red, blue, and green color patterns.

Next, a curable composition for forming an infrared transmitting filter, which was prepared by further adding a coloring material that shields visible light to the curable composition according to the present invention, was applied to the color patterns using a spin coating method such that the thickness of the formed film was 2.0 µm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, a 2 µm Bayer pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering and was washed with pure water. Next, the washed silicon wafer was heated using a hot plate at 200° C. for 5 minutes. As a result, the infrared transmitting filter was patterned on a portion where the Bayer pattern of the near infrared cut filter was not formed. This filter was incorporated into a solid image pickup element using a well-known method.

EXPLANATION OF REFERENCES

110: solid image pickup element
111: near infrared cut filter
112: color filter
114: infrared transmitting filter
115: microlens
116: planarizing layer

What is claimed is:

1. A curable composition comprising:
a near infrared absorbing compound that includes a cation having an absorption in a near infrared range and an anion;
a salt of an anion that is a component other than the near infrared absorbing compound and has a conjugate acid pKa of −8 or lower; and
a curable compound.

2. The curable composition according to claim 1, wherein the near infrared absorbing compound includes the cation having an absorption in a near infrared range, and an anion that is present outside a molecule of the cation having an absorption in a near infrared range.

3. The curable composition according to claim 1, wherein the salt of the anion having a conjugate acid pKa of −8 or lower does not have a maximum absorption wavelength in a visible range.

4. The curable composition according to claim 1, wherein a molecular weight of the salt of the anion having a conjugate acid pKa of −8 or lower is 100 to 2000.

5. The curable composition according to claim 1, wherein a content of the salt of the anion having a conjugate acid pKa of −8 or lower is 0.05 to 5 mol with respect to 1 mol of the near infrared absorbing compound.

6. The curable composition according to claim 1, wherein the near infrared absorbing compound is at least one selected from the group consisting of a cyanine compound and a diimmonium compound.

7. The curable composition according to claim 1, wherein the near infrared absorbing compound is at least one selected from the group consisting of a compound represented by the following Formula (A1) and a compound represented by the following Formula (A2),

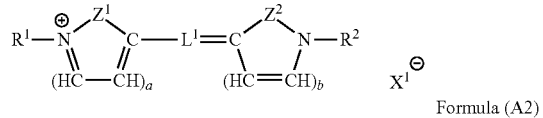

Formula (A1)

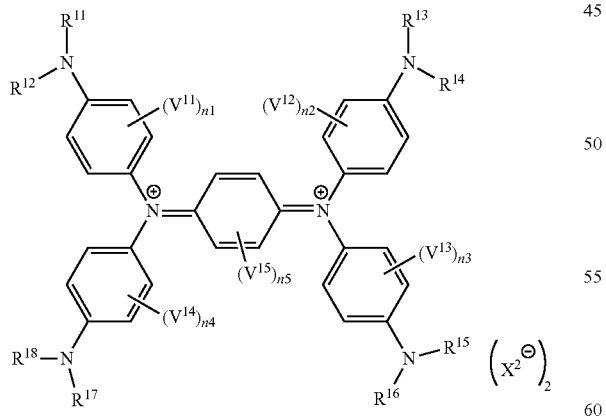

Formula (A2)

in Formula (A1), $Z^1$ and $Z^2$ each independently represent a non-metal atomic group for forming a 5- or 6-membered nitrogen-containing heterocycle which may be fused, $R^1$ and $R^2$ each independently represent an aliphatic group or an aromatic group, $L^1$ represents a methine chain including an odd number of methine groups, a and b each independently represent 0 or 1, and $X^1$ represents an anion; and in Formula (A2), $R^{11}$ to $R^{18}$ each independently represent an alkyl group or an aryl group, $V^{11}$ to $V^{15}$ each independently represent an alkyl group, an aryl group, a halogen atom, an alkoxy group, or a cyano group, $X^2$ represents an anion, and n1 to n5 each independently represent an integer of 0 to 4.

8. The curable composition according to claim 1, wherein the near infrared absorbing compound includes an anion having a conjugate acid pKa of −8 or lower.

9. The curable composition according to claim 1, wherein the salt of the anion having a conjugate acid pKa of −8 or lower is at least one selected from the group consisting of a salt of an anion having a partial structure represented by the following Formula (B1), a salt of an anion having a partial structure represented by the following Formula (B2), and a salt of an anion represented by the following Formula (B3),

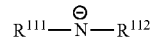
(B1)

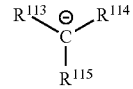
(B2)

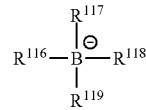
(B3)

in Formula (B1), $R^{111}$ and $R^{112}$ each independently represent —SO$_2$— or —CO—;

in Formula (B2), $R^{113}$ represents —SO$_2$— or —CO— and $R^{114}$ and $R^{115}$ each independently represent —SO$_2$—, —CO—, or a cyano group; and in Formula (B3), $R^{116}$ to $R^{119}$ each independently represent a halogen atom, an alkyl group, an aryl group, an alkoxy group, an aryloxy group, or a cyano group.

10. The curable composition according to claim 1, wherein the salt of the anion having a conjugate acid pKa of −8 or lower is at least one selected from the group consisting of a salt of an anion represented by the following Formula (B1-1), a salt of an anion represented by the following Formula (B2-1), and a salt of an anion represented by the following Formula (B3),

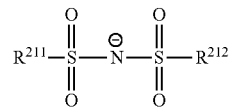
(B1-1)

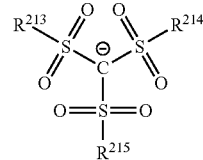
(B2-1)

-continued (B3)

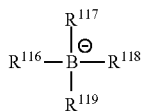

in Formula (B1-1), $R^{211}$ and $R^{212}$ each independently represent a halogen atom or an alkyl group, and in a case where $R^{211}$ and $R^{212}$ each independently represent an alkyl group, $R^{211}$ and $R^{212}$ may be bonded to each other to form a ring;

in Formula (B2-1), $R^{213}$ to $R^{215}$ each independently represent a halogen atom or an alkyl group, in a case where $R^{213}$ and $R^{214}$ each independently represent an alkyl group, $R^{213}$ and $R^{214}$ may be bonded to each other to form a ring, in a case where $R^{214}$ and $R^{215}$ each independently represent an alkyl group, $R^{214}$ and $R^{215}$ may be bonded to each other to form a ring, and in a case where $R^{213}$ and $R^{215}$ each independently represent an alkyl group, $R^{213}$ and $R^{215}$ may be bonded to each other to form a ring; and in Formula (B3), $R^{116}$ to $R^{119}$ each independently represent a halogen atom, an alkyl group, an aryl group, an alkoxy group, an aryloxy group, or a cyano group.

11. The curable composition according to claim 1, wherein the salt of the anion having a conjugate acid pKa of −8 or lower is at least one selected from the group consisting of a bis(fluoroalkylsulfonyl)imide salt, a tris(fluoroalkylsulfonyl)methide salt, and a tetracyanoborate salt.

12. A cured film which is formed using the curable composition according to claim 1.

13. An optical filter comprising:
the cured film according to claim 12.

14. The optical filter according to claim 13, wherein the optical filter is a near infrared cut filter or an infrared transmitting filter.

15. The optical filter according to claim 13 comprising:
a pixel of the cured film formed using a curable composition; and
at least one pixel selected from the group consisting of a red pixel, a green pixel, a blue pixel, a magenta pixel, a yellow pixel, a cyan pixel, a black pixel, and an achromatic pixel,
wherein the curable composition includes,
a near infrared absorbing compound that includes a cation having an absorption in a near infrared range and an anion;
a salt of an anion that is a component other than the near infrared absorbing compound and has a conjugate acid pKa of −8 or lower; and
a curable compound.

16. A laminate comprising:
the cured film according to claim 12; and
a color filter that includes a chromatic colorant.

17. A solid image pickup element comprising:
the cured film according to claim 12.

18. An image display device comprising:
the cured film according to claim 12.

19. An infrared sensor comprising:
the cured film according to claim 12.

* * * * *